(12) United States Patent
Yamazaki

(10) Patent No.: US 9,590,112 B2
(45) Date of Patent: Mar. 7, 2017

(54) SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 78 days.

(21) Appl. No.: 14/543,273

(22) Filed: Nov. 17, 2014

(65) Prior Publication Data

US 2015/0069392 A1    Mar. 12, 2015

Related U.S. Application Data

(63) Continuation of application No. 13/154,473, filed on Jun. 7, 2011, now Pat. No. 8,916,865.

(30) Foreign Application Priority Data

Jun. 18, 2010 (JP) ................................. 2010-138950

(51) Int. Cl.
*H01L 29/786* (2006.01)
*H01L 29/423* (2006.01)
*H01L 29/49* (2006.01)

(52) U.S. Cl.
CPC .... *H01L 29/7869* (2013.01); *H01L 29/42384* (2013.01); *H01L 29/4908* (2013.01); *H01L 29/78648* (2013.01)

(58) Field of Classification Search
CPC ............. H01L 27/1225; H01L 29/7831; H01L 29/7869; H01L 29/66742; H01L 21/32055;

(Continued)

(56) References Cited

U.S. PATENT DOCUMENTS 5,650,201 A *  7/1997  Tompa .................... C23C 14/48
                                                    427/255.394
5,731,856 A    3/1998  Kim et al.
(Continued)

FOREIGN PATENT DOCUMENTS

CN         102165570 A       8/2011
EP           1737044 A      12/2006
(Continued)

OTHER PUBLICATIONS

International Search Report (Application No. PCT/JP2011/063091) Dated Aug. 16, 2011.

(Continued)

*Primary Examiner* — William F Kraig
*Assistant Examiner* — Edward Chin
(74) *Attorney, Agent, or Firm* — Robinson Intellectual Property Law Office; Eric J. Robinson

(57) ABSTRACT

An object is to provide a semiconductor device including an oxide semiconductor, which has stable electric characteristics and high reliability. In a transistor including an oxide semiconductor film, the oxide semiconductor film is subjected to dehydration or dehydrogenation performed by heat treatment. In addition, as a gate insulating film in contact with the oxide semiconductor film, an insulating film containing oxygen, preferably, a gate insulating film including a region containing oxygen with a higher proportion than the stoichiometric composition is used. Thus, oxygen is supplied from the gate insulating film to the oxide semiconductor film. Further, a metal oxide film is used as part of the gate insulating film, whereby reincorporation of an impurity such as hydrogen or water into the oxide semiconductor is suppressed.

19 Claims, 9 Drawing Sheets

(58) Field of Classification Search
CPC ......... H01L 29/41733; H01L 29/42384; H01L 29/66969; H01L 29/78606; H01L 29/78633; H01L 29/78696; H01L 21/324
USPC .............................. 257/43, E29.296; 438/104
See application file for complete search history.

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 * | 4/2004 | Kawasaki ............... H01L 27/15 257/102 |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 * | 11/2008 | Saito ................. H01L 27/14601 250/338.4 |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,576,394 | B2 | 8/2009 | Furuta et al. |
| 7,601,984 | B2 * | 10/2009 | Sano ..................... H01L 21/428 257/52 |
| 7,674,650 | B2 * | 3/2010 | Akimoto ............. H01L 27/1225 257/E21.347 |
| 7,732,819 | B2 | 6/2010 | Akimoto et al. |
| 7,791,072 | B2 * | 9/2010 | Kumomi ........... H01L 27/14621 257/57 |
| 7,923,711 | B2 * | 4/2011 | Shima .................... H01L 45/04 257/2 |
| 7,952,668 | B2 * | 5/2011 | Kakinuma ............ G02F 1/1334 349/122 |
| 7,981,734 | B2 * | 7/2011 | Furuta ............... H01L 29/41733 257/E21.256 |
| 7,994,500 | B2 * | 8/2011 | Kim .................. H01L 29/78606 257/258 |
| 8,049,225 | B2 | 11/2011 | Yamazaki et al. |
| 8,058,645 | B2 * | 11/2011 | Jeong ................. H01L 27/1225 257/43 |
| 8,148,779 | B2 * | 4/2012 | Jeong .................. H01L 29/4908 257/347 |
| 8,188,480 | B2 * | 5/2012 | Itai .................... H01L 29/78618 257/288 |
| 8,203,143 | B2 * | 6/2012 | Imai ................... H01L 29/7869 257/43 |
| 8,293,595 | B2 | 10/2012 | Yamazaki et al. |
| 8,502,221 | B2 | 8/2013 | Yamazaki |
| 8,785,242 | B2 | 7/2014 | Yamazaki et al. |
| 8,841,710 | B2 | 9/2014 | Yamazaki et al. |
| 8,884,282 | B2 | 11/2014 | Yamazaki |
| 9,059,295 | B2 * | 6/2015 | Yamazaki ............ H01L 29/7831 |
| 9,147,768 | B2 | 9/2015 | Yamazaki |
| 9,190,522 | B2 | 11/2015 | Yamazaki |
| 9,196,739 | B2 | 11/2015 | Yamazaki |
| 9,318,613 | B2 | 4/2016 | Yamazaki |
| 2001/0046027 | A1 | 11/2001 | Tai et al. |
| 2002/0014624 | A1 | 2/2002 | Yamazaki et al. |
| 2002/0056838 | A1 * | 5/2002 | Ogawa ................ G02F 1/13439 257/59 |
| 2002/0132454 | A1 | 9/2002 | Ohtsu et al. |
| 2003/0189401 | A1 * | 10/2003 | Kido ..................... C07C 211/58 313/504 |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 * | 5/2006 | Yabuta ............... H01L 29/78618 438/151 |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 * | 8/2006 | Isa ....................... H01L 51/0022 257/40 |
| 2006/0170111 | A1 | 8/2006 | Isa et al. |
| 2006/0197092 | A1 | 9/2006 | Hoffman et al. |
| 2006/0208977 | A1 * | 9/2006 | Kimura ................ G09G 3/2014 345/76 |
| 2006/0228974 | A1 | 10/2006 | Thelss et al. |
| 2006/0231882 | A1 | 10/2006 | Kim et al. |
| 2006/0238135 | A1 * | 10/2006 | Kimura ................... G09G 3/20 315/169.3 |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 * | 7/2008 | Cowdery-Corvan . C23C 16/407 438/104 |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 * | 10/2008 | Park .................. H01L 29/78618 257/43 |
| 2008/0258143 | A1 | 10/2008 | Kim et al. |
| 2008/0296568 | A1 | 12/2008 | Ryu et al. |
| 2008/0299702 | A1 | 12/2008 | Son et al. |
| 2008/0308806 | A1 * | 12/2008 | Akimoto ............. H01L 27/1225 257/59 |
| 2009/0008639 | A1 | 1/2009 | Akimoto et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0261325 | A1 * | 10/2009 | Kawamura ......... H01L 27/1214 257/43 |
| 2009/0278122 | A1 | 11/2009 | Hosono et al. |
| 2009/0280600 | A1 | 11/2009 | Hosono et al. |
| 2010/0025677 | A1 * | 2/2010 | Yamazaki ............ H01L 27/1225 257/43 |

(56) References Cited

U.S. PATENT DOCUMENTS

| | | | |
|---|---|---|---|
| 2010/0032665 A1 | 2/2010 | Yamazaki et al. | |
| 2010/0065844 A1 | 3/2010 | Tokunaga | |
| 2010/0092800 A1 | 4/2010 | Itagaki et al. | |
| 2010/0102314 A1* | 4/2010 | Miyairi | H01L 29/42384 257/43 |
| 2010/0109002 A1 | 5/2010 | Itagaki et al. | |
| 2010/0117079 A1* | 5/2010 | Miyairi | H01L 27/1225 257/43 |
| 2010/0295042 A1* | 11/2010 | Yano | H01L 29/7869 257/43 |
| 2011/0065216 A1* | 3/2011 | Kaji | H01L 22/14 438/16 |
| 2011/0101335 A1* | 5/2011 | Yamazaki | H01L 27/1225 257/43 |
| 2011/0180802 A1* | 7/2011 | Morosawa | H01L 29/7869 257/59 |
| 2011/0193083 A1 | 8/2011 | Kim et al. | |
| 2011/0201206 A1* | 8/2011 | Ishikawa | C23C 16/347 438/703 |
| 2012/0068250 A1* | 3/2012 | Ino | H01L 21/28282 257/321 |
| 2012/0119205 A1* | 5/2012 | Taniguchi | H01L 29/78693 257/43 |
| 2014/0329365 A1 | 11/2014 | Yamazaki et al. | |
| 2015/0060850 A1 | 3/2015 | Yamazaki et al. | |
| 2015/0060852 A1 | 3/2015 | Yamazaki | |
| 2015/0171116 A1* | 6/2015 | Okazaki | H01L 27/1225 257/43 |
| 2015/0311347 A1 | 10/2015 | Yamazaki | |
| 2016/0118502 A1* | 4/2016 | Yamazaki | H01L 29/7869 257/43 |
| 2016/0225908 A1 | 8/2016 | Yamazaki | |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165527 A | 6/2006 |
| JP | 2006-165528 A | 6/2006 |
| JP | 2006-165529 A | 6/2006 |
| JP | 2007-096055 A | 4/2007 |
| JP | 2007-123861 A | 5/2007 |
| JP | 2007-258223 A | 10/2007 |
| JP | 2008-535205 | 8/2008 |
| JP | 2009-231613 A | 10/2009 |
| JP | 2010-016347 A | 1/2010 |
| JP | 2010-056541 A | 3/2010 |
| JP | 2010-056546 A | 3/2010 |
| JP | 2010-062548 A | 3/2010 |
| JP | 2010-067954 A | 3/2010 |
| JP | 2010-114413 A | 5/2010 |
| JP | 2010114413 A * | 5/2010 |
| JP | 2010-123939 A | 6/2010 |
| WO | WO-2004/114391 | 12/2004 |
| WO | WO-2007/089048 | 8/2007 |
| WO | WO-2009/093625 | 7/2009 |
| WO | WO-2010/024279 | 3/2010 |
| WO | WO-2010/041686 | 4/2010 |

OTHER PUBLICATIONS

Written Opinion (Application No. PCT/JP2011/063091) Dated Aug. 16, 2011.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

(56) References Cited

OTHER PUBLICATIONS

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent.Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties, SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic NANO-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", Nirim Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3-A2O3-Bo Systems [A; Fe, Ga, Or, Al; B: Mg, Fe, Ni, Cu,Or Zn] at Temperatures Over 1000° C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

(56) References Cited

OTHER PUBLICATIONS

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cyrst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nakayama et al., "17a-TL-8 Effect of GaO Layer on IGZO-TFT Channel", Extended Abstracts (The 57th Spring Meeting 2010, The Japan Society of Applied Physics and Related Societies, Mar. 17, 2010.

Taiwanese Office Action (Application No. 105106321) Dated Sep. 8, 2016.

\* cited by examiner

SEMICONDUCTOR DEVICE

TECHNICAL FIELD

The present invention relates to a semiconductor device and a method for manufacturing the semiconductor device.

In this specification, a semiconductor device generally means a device which operates by utilizing semiconductor characteristics, and an electrooptic device, a semiconductor circuit, and electronic equipment are all semiconductor devices.

BACKGROUND ART

A technique by which transistors are formed using semiconductor thin films over a substrate having an insulating surface has been attracting attention. The transistor is applied to a wide range of electronic devices such as an integrated circuit (IC) and an image display device (display device). A silicon-based semiconductor material is widely known as a material for a semiconductor thin film applicable to a transistor. As another material, an oxide semiconductor has been attracting attention.

For example, a transistor whose active layer uses an amorphous oxide containing indium (In), gallium (Ga), and zinc (Zn) and having an electron carrier concentration of less than $10^{18}/cm^3$ is disclosed (see Patent Document 1).

REFERENCE

[Patent Document 1] Japanese Published Patent Application No. 2006-165528

DISCLOSURE OF INVENTION

However, electrical conductivity of the oxide semiconductor may potentially change in the following case: the oxide semiconductor has deviation from the stoichiometric composition because of oxygen vacancy; a factor such as hydrogen or water causing formation of an electron donor enters the oxide semiconductor in a manufacturing process of a device; or the like. Such a phenomenon becomes a cause of variation in the electric characteristics of a semiconductor device such as a transistor, including the oxide semiconductor.

In view of the above problem, an object is to provide a semiconductor device including an oxide semiconductor, which has stable electric characteristics and high reliability.

In an embodiment of the invention to be disclosed, an oxide semiconductor film is dehydrated or dehydrogenated by performance of heat treatment, and as a gate insulating film in contact with the oxide semiconductor film, an insulating film containing oxygen, preferably a gate insulating film which includes a region containing oxygen with a higher proportion than the stoichiometric composition is used, so that oxygen is supplied from the gate insulating film to the oxide semiconductor film. Further, a metal oxide film is used as part of the gate insulating film, whereby reincorporation of an impurity such as hydrogen or water to the oxide semiconductor film is suppressed. Specifically, structures described below can be employed, for example.

An embodiment of the present invention is a semiconductor device including a first gate electrode, a first gate insulating film covering the first gate electrode, an oxide semiconductor film provided to be in contact with the first gate insulating film and overlap with the first gate electrode, a source electrode and a drain electrode in contact with the oxide semiconductor film, a second gate insulating film provided to cover the source electrode and the drain electrode and be in contact with the oxide semiconductor film, and a second gate electrode provided to be in contact with the second gate insulating film and overlap with the oxide semiconductor film. The first gate insulating film has a structure in which a first metal oxide film containing oxygen and an element belonging to Group 13 and a first insulating film containing oxygen are stacked in this order from the first gate electrode side. The second gate insulating film has a structure in which a second insulating film containing oxygen and a second metal oxide film containing oxygen and an element belonging to Group 13 are stacked in this order from the oxide semiconductor film side.

In the above semiconductor device, it is preferable that the first metal oxide film containing oxygen and an element belonging to Group 13 and the second metal oxide film containing oxygen and an element belonging to Group 13 include a region containing oxygen with a higher proportion than the stoichiometric composition.

Further, in the above semiconductor device, it is preferable that the first insulating film and the second insulating film include a region containing oxygen with a higher proportion than the stoichiometric composition.

Further, in the above semiconductor device, it is preferable that the first metal oxide film and the second metal oxide film contain one or more of the following metal oxides: gallium oxide, aluminum oxide, aluminum gallium oxide, and gallium aluminum oxide.

Further, in the above semiconductor device, the first gate insulating film and the second gate insulating film may be provided to be partly in contact with each other.

Note that electrical conductivity of an oxide semiconductor changes when the oxide semiconductor is deviated from its stoichiometric composition because of an excess or a deficiency of oxygen, or hydrogen or water causing formation of an electron donor enters the oxide semiconductor in a thin film formation process. Such a phenomenon becomes a factor of variation in the electric characteristics of a transistor including the oxide semiconductor. Thus, an impurity such as hydrogen, water, a hydroxyl group, or a hydride (also referred to as a hydrogen compound) is intentionally removed from the oxide semiconductor. In addition, oxygen which is a main component of the oxide semiconductor and may be reduced through the step of removing an impurity is supplied from the gate insulating film in contact with the oxide semiconductor film. As a result, the oxide semiconductor film is highly purified and becomes an electrically i-type (intrinsic) oxide semiconductor.

Oxygen is diffused from the gate insulating film into the oxide semiconductor film so as to be reacted with hydrogen which is one of factors making a semiconductor device unstable, whereby hydrogen inside or at the interface of the oxide semiconductor film can be fixed (made to be immovable ions). That is, instability can be sufficiently decreased and reliability can be improved. In addition, variation in the threshold voltages Vth or shift in the threshold voltage (ΔVth), which is due to oxygen vacancy inside or at the interface of the oxide semiconductor film, can be reduced.

The electric characteristics of the transistor including a highly purified oxide semiconductor film, such as the threshold voltage and the on-state current, have almost no temperature dependence. Further, transistor characteristics hardly change due to light deterioration.

In the semiconductor device according to an embodiment of the invention to be disclosed, as well as the first gate electrode provided below the oxide semiconductor film, the second gate electrode (so-called back gate electrode) is provided at a position which overlaps with a channel formation region of the oxide semiconductor film, so that the amount of shift in the threshold voltage of the transistor between before and after the bias-temperature thermal stress test can be reduced.

According to an embodiment of the present invention, a transistor having stable electric characteristics can be provided.

In addition, according to an embodiment of the present invention, a semiconductor device including a transistor, which has favorable electric characteristics and high reliability, can be manufactured.

BEST MODE FOR CARRYING OUT THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Note that the ordinal numbers such as "first" and "second" in this specification are used for convenience and do not denote the order of steps and the stacking order of layers. In addition, the ordinal numbers in this specification do not denote particular names which specify the present invention.

Embodiment 1

In this embodiment, one embodiment of a semiconductor device and a manufacturing method of the semiconductor device will be described with reference to FIGS. 1A to 1C and FIGS. 2A to 2C.
<Example of Structure of Semiconductor Device>

Figure 1A:
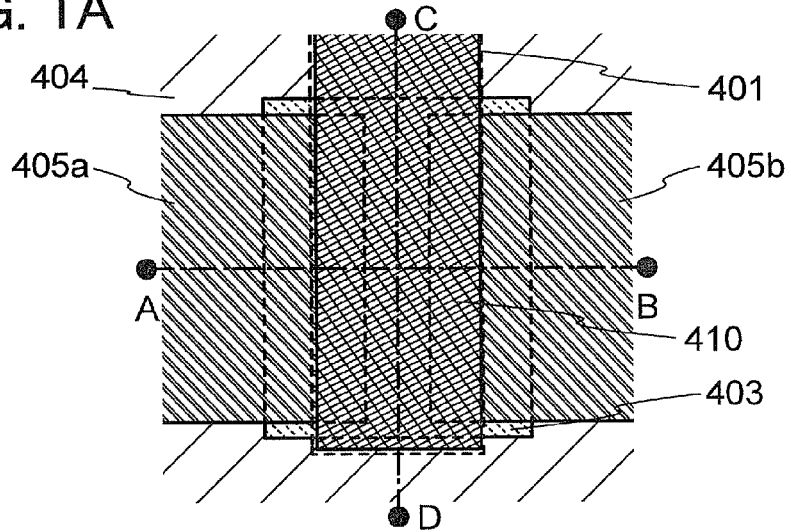
FIGS. 1A to 1C are a plan view and cross-sectional views illustrating an embodiment of a semiconductor device.
Figure 1B:
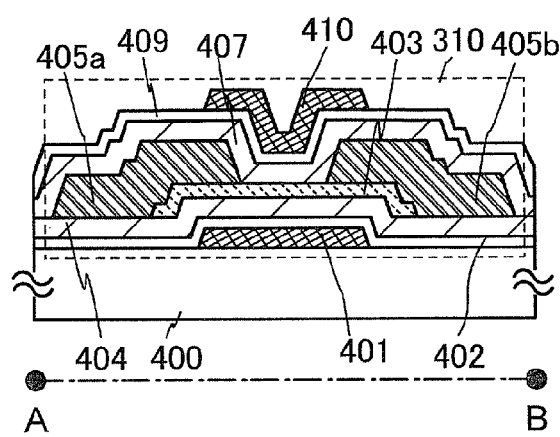
Figure 1C:
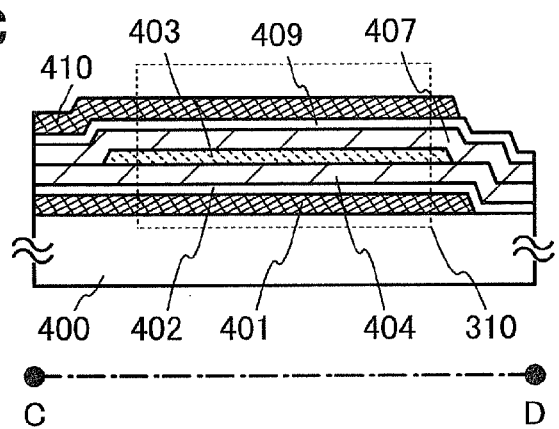

FIGS. 1A to 1C are a plan view and cross-sectional views of a transistor as an example of a semiconductor device. Here, FIG. 1A is a plan view and FIGS. 1B and 1C are cross-sectional views taken along a line A-B and a line C-D, respectively, of FIG. 1A. Note that part of components of a transistor 310 (e.g., a second insulating film 407, a second metal oxide film 409, and the like) is omitted in FIG. 1A for brevity.

The transistor 310 illustrated in FIGS. 1A to 1C includes, over a substrate 400 having an insulating surface, a first gate electrode 401, a first gate insulating film including a first metal oxide film 402 and a first insulating film 404, an oxide semiconductor film 403, a source electrode 405a, a drain electrode 405b, a second gate insulating film including the second insulating film 407 and the second metal oxide film 409, and a second gate electrode 410.

In the transistor 310 illustrated in FIGS. 1A to 1C, the second insulating film 407 is provided to cover the source electrode 405a and the drain electrode 405b and be in contact with the first insulating film 404 and the oxide semiconductor film 403. Further, in the transistor 310 illustrated in FIGS. 1A to 1C, the second insulating film 407 and the first insulating film 404 are in contact with each other in a region where the oxide semiconductor film 403 is not provided. That is, the oxide semiconductor film 403 is surrounded by the first gate insulating film and the second gate insulating film.

Here, the oxide semiconductor film 403 is preferably a highly purified oxide semiconductor film formed by sufficiently removing an impurity such as hydrogen or water or sufficiently supplying oxygen. Specifically, the hydrogen concentration in the oxide semiconductor film 403 is $5 \times 10^{19}$ atoms/cm$^3$ or lower, preferably $5 \times 10^{18}$ atoms/cm$^3$ or lower, further preferably $5 \times 10^{17}$ atoms/cm$^3$ or lower. Note that the hydrogen concentration in the oxide semiconductor film 403 is measured by secondary ion mass spectroscopy (SIMS). In the oxide semiconductor film 403 which is highly purified by sufficiently reducing the hydrogen concentration and in which defect levels in an energy gap due to oxygen vacancy are decreased by supplying a sufficient amount of oxygen, the carrier concentration is lower than $1 \times 10^{12}$/cm$^3$, preferably lower than $1 \times 10^{11}$/cm$^3$, further preferably lower than $1.45 \times 10^{10}$/cm$^3$. For example, the off-state current (here, current per micrometer (m) of channel width) at room temperature (25° C.) is lower than or equal to 100 zA (1 zA (zeptoampere) is $1 \times 10^{-21}$ A), preferably lower than or equal to 10 zA. With an i-type oxide semiconductor formed as described above, a transistor having excellent electric characteristics can be obtained.

As for the first insulating film 404 and the second insulating film 407 each of which is in contact with the oxide semiconductor film 403, an insulating film containing oxygen is preferable, and a film including a region containing oxygen with a higher proportion than the stoichiometric composition (the region also referred to as an oxygen excess region) is further preferable. When the first insulating film 404 and the second insulating film 407 each of which is in contact with the oxide semiconductor film 403 include an oxygen excess region, oxygen can be prevented from transferring from the oxide semiconductor film 403 to the first insulating film 404 or the second insulating film 407. Further, oxygen can be supplied to the oxide semiconductor film 403 from the first insulating film 404 or the second insulating film 407. Thus, the oxide semiconductor film 403 sandwiched between the first insulating film 404 and the second insulating film 407 can be a film containing a sufficient amount of oxygen.

For example, a silicon oxide film can be used as each of the first insulating film 404 and the second insulating film 407. Silicon oxide can be represented by SiO$_x$, and the value of x is determined so that the proportion of oxygen can be higher than that in the stoichiometric composition, which is preferable. For example, the preferable value of x is larger than 2.0.

It is preferable that the first insulating film 404 and the second insulating film 407 be formed using a same material because adhesiveness between the first insulating film 404 and the second insulating film 407 can be increased in a structure where they are in contact with each other in a region where the oxide semiconductor film 403 is not provided. In addition, it is further preferable that the composition ratio of the first insulating film 404 be equal to that of the second insulating film 407.

The first metal oxide film 402 is a film over which the first insulating film 404 is stacked, which functions as the first gate insulating film. The second metal oxide film 409 is a film stacked over the second insulating film 407, which functions as the second gate insulating film. The first metal oxide film 402 and the second metal oxide film 409 can be formed using a material containing oxygen and an element belonging to Group 13. As the material containing oxygen and an element belonging to Group 13, for example, one or more of the following metal oxides: gallium oxide, aluminum oxide, aluminum gallium oxide, and gallium aluminum oxide can be used. Here, aluminum gallium oxide refers to a material in which the amount of aluminum (atomic %) is larger than that of gallium (atomic %), and gallium aluminum oxide refers to a material in which the amount of gallium (atomic %) is larger than or equal to that of aluminum (atomic %). Each of the first metal oxide film 402 and the second metal oxide film 409 may have a single-layer structure or a stacked structure formed using any of the above materials. Since water hardly penetrates aluminum oxide, it is preferable to use a material such as aluminum oxide, aluminum gallium oxide, or gallium aluminum oxide for prevention of entrance of water to the oxide semiconductor film.

Further, each of the first metal oxide film 402 and the second metal oxide film 409 preferably includes a region containing oxygen with a higher proportion than the stoichiometric composition. Oxygen is supplied to the oxide semiconductor film 403 or the insulating film in contact with the oxide semiconductor film 403, so that a defect of oxygen vacancy in the oxide semiconductor film 403 or at an interface between the oxide semiconductor film 403 and the insulating film can be suppressed. For example, in the case where gallium oxide is used for the first or second metal oxide film, the preferable metal oxide is represented by $Ga_2O_{3+\alpha}$ ($\alpha>0$). For example, the value of a may be larger than or equal to 0.04 and smaller than or equal to 0.09. Alternatively, in the case where aluminum oxide is used for the first or second metal oxide film, the preferable metal oxide is $Al_2O_{3+\alpha}$ ($\alpha>0$). Alternatively, in the case where aluminum gallium oxide is used for the first or second metal oxide film, the preferable metal oxide is represented by $Al_xGa_{2-x}O_{3+\alpha}$ ($1<x<2$, $\alpha>0$). Alternatively, in the case where gallium aluminum oxide is used for the first or second metal oxide film, the preferable metal oxide is represented by $Al_xGa_{2-x}O_{3+\alpha}$ ($0<x\leq1$, preferably, $0<x<0.4$, and $\alpha>0$).

In the case where an oxide semiconductor film without defects (oxygen vacancies) is used, a gate insulating film including the first insulating film and the first metal oxide film or a gate insulating film including the second insulating film and the second metal oxide film preferably contains oxygen whose proportion corresponds to that in the stoichiometric composition. However, in order to obtain reliability of the transistor, such as suppression of shift in the threshold voltage, a larger amount of oxygen is preferably contained in the gate insulating film so that the proportion of oxygen can be higher than that in the stoichiometric composition; otherwise the oxide semiconductor film may have oxygen vacancies.

An insulator may further be formed over the transistor 310. Further, an opening may be formed in the first metal oxide film 402, the first insulating film 404, the second insulating film 407, the second metal oxide film 409, or the like so that the source electrode 405a or the drain electrode 405b is electrically connected to a wiring. Note that it is not always necessary but desirable to process the oxide semiconductor film 403 into an island shape.

Figure 2A:
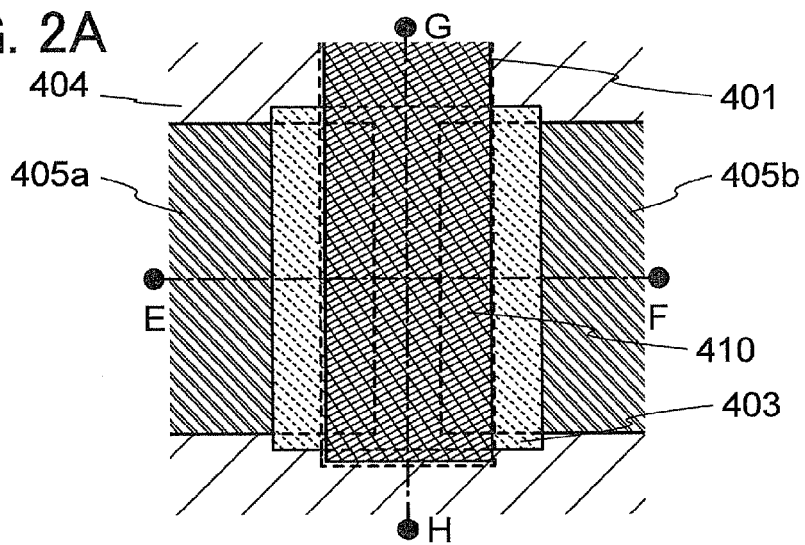
FIGS. 2A to 2C are a plan view and cross-sectional views illustrating an embodiment of a semiconductor device.
Figure 2B:
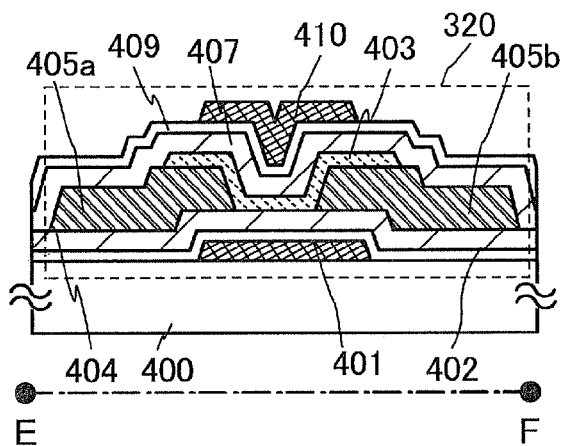
Figure 2C:
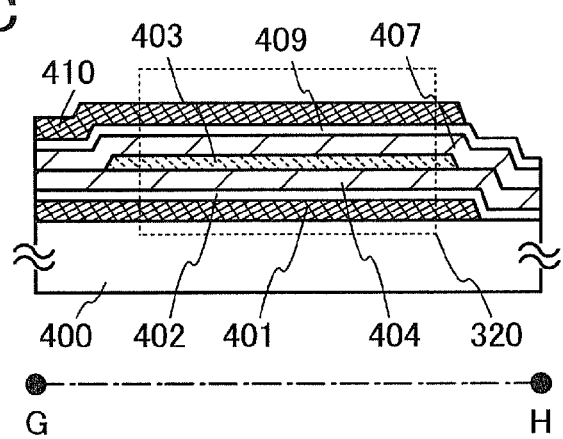

FIGS. 2A to 2C are a plan view and cross-sectional views of a transistor 320 which has a different structure from the transistor 310. FIG. 2A is a plane view, and FIGS. 2B and 2C are cross-sectional views taken along a line E-F and a line G-H, respectively, of FIG. 2A. Note that part of components of the transistor 320 (e.g., a second insulating film 407, the second metal oxide film 409, and the like) is omitted in FIG. 2A for brevity.

Like the transistor 310, the transistor 320 illustrated in FIGS. 2A to 2C includes, over the substrate 400 having an insulating surface, the first gate electrode 401, the first gate insulating film including the first metal oxide film 402 and the first insulating film 404, the source electrode 405a, the drain electrode 405b, the oxide semiconductor film 403, the second gate insulating film including the second insulating film 407 and the second metal oxide film 409, and the second gate electrode 410. A difference between the transistor 310 in FIGS. 1A to 1C and the transistor 320 in FIGS. 2A to 2C is in a position where the oxide semiconductor film 403 is connected to the source electrode 405a and the drain electrode 405b. That is, in the transistor 320, a bottom of the oxide semiconductor film 403 is in contact with the source electrode 405a and the drain electrode 405b.

In the transistor 320 illustrated in FIGS. 2A to 2C, the second insulating film 407 is provided to cover the source electrode 405a and the drain electrode 405b and be in contact with the first insulating film 404 and the oxide semiconductor film 403, which is similar to the transistor 310 illustrated in FIGS. 1A to 1C. Further, in the transistor 320, the second insulating film 407 and the first insulating film 404 are in contact with each other in a region where the oxide semiconductor film 403 is not provided. That is, the oxide semiconductor film 403 is provided to be surrounded by the first gate insulating film and the second gate insulating film.

<Example of Manufacturing Process of Transistor>

Hereinafter, a manufacturing process of a transistor according to this embodiment will be described with reference to FIGS. 3A to 3E and FIGS. 4A to 4C.

<Manufacturing Process of Transistor 310>

An example of a manufacturing process of the transistor 310 in FIGS. 1A to 1C will be described with reference to FIGS. 3A to 3E.

First, a conductive film is formed over the substrate 400 having an insulating surface, and then, the first gate electrode 401 is formed by performance of a first photolithography step. Note that a resist mask may be formed by an inkjet method. Formation of the resist mask by an inkjet method needs no photomask; thus, manufacturing cost can be reduced.

Although there is no particular limitation on a substrate which can be used as the substrate 400 having an insulating surface, it is necessary that the substrate have at least heat resistance high enough to withstand heat treatment to be performed later. For example, a substrate such as a glass substrate, a ceramic substrate, a quartz substrate, or a sapphire substrate can be used. As long as the substrate 400 has an insulating surface, a single crystal semiconductor substrate or a polycrystalline semiconductor substrate of silicon, carbon silicon, or the like; a compound semiconductor substrate of silicon germanium or the like; an SOI substrate; or the like can be used, and a semiconductor element may be provided over the substrate. A flexible substrate may be used as the substrate 400.

An insulating film serving as a base film may be provided between the substrate 400 and the first gate electrode 401. The base film has a function of preventing diffusion of an impurity element from the substrate 400, and can be formed with a single-layer structure of a silicon nitride film, a silicon oxide film, a silicon nitride oxide film, or a silicon oxynitride film or a stacked structure using any of the above films.

In addition, the first gate electrode 401 can be formed to have a single-layer structure or a stacked structure using any of metal materials such as molybdenum, titanium, tantalum, tungsten, aluminum, copper, neodymium, and scandium, or an alloy material which contains any of these materials as a main component.

Next, a first metal oxide film 402 is formed over the first gate electrode 401. The first metal oxide film 402 is preferably formed to a thickness, for example, greater than or equal to 3 nm and less than or equal to 150 nm, further preferably, greater than or equal to 9 nm and less than or equal to 100 nm. The first metal oxide film 402 can be formed using a material containing oxygen and an element belonging to Group 13. For example, one or more of the following metal oxides: gallium oxide, aluminum oxide, aluminum gallium oxide, and gallium aluminum oxide can be used. Further, the first metal oxide film 402 can contain oxygen and a plurality of kinds of elements belonging to Group 13. Alternatively, an impurity element other than hydrogen, e.g., an element belonging to Group 3 such as yttrium, an element belonging to Group 4 such as hafnium, an element belonging to Group 14 such as silicon, nitrogen, or the like can be contained instead of an element belong to Group 13. Such an impurity element is contained at about higher than 0% and lower than or equal to 20 atomic %, for example, whereby an energy gap of the first metal oxide film 402 can be controlled with the additive amount of the element.

The first metal oxide film 402 is preferably formed by using a method with which an impurity such as water or hydrogen does not enter the first metal oxide film 402. If an impurity such as hydrogen or water is contained in the first metal oxide film 402, an impurity such as hydrogen or water may enter an oxide semiconductor film to be formed later or may cause extraction of oxygen in the oxide semiconductor film. As a result, resistance of the oxide semiconductor film is reduced (the oxide semiconductor film is to be an n-type oxide semiconductor film) and a parasitic channel may be formed. In other words, it is preferable that the first metal oxide film 402 be formed so as to contain an impurity such as hydrogen or water as little as possible. For example, the first metal oxide film 402 is preferably formed by a sputtering method. A high-purity gas from which an impurity such as hydrogen or water is removed is preferable for a sputtering gas used in film formation.

As a sputtering method, a DC sputtering method using a direct-current power supply, a pulsed DC sputtering method in which a DC bias is applied in a pulsed manner, an AC sputtering method, or the like can be used.

Note that in the case where an aluminum gallium oxide film or a gallium aluminum oxide film is formed as the first metal oxide film 402, a gallium oxide target to which an aluminum particle is added may be applied as a target used in a sputtering method. Using a gallium oxide target to which an aluminum particle is added can make conductivity of the target increase; thus, discharge during sputtering can be facilitated. With such a target, a metal oxide film suitable for mass production can be manufactured.

Next, oxygen doping treatment is preferably performed on the first metal oxide film 402. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk.

Oxygen doping treatment is performed on the first metal oxide film 402, whereby a region containing oxygen with a higher proportion than the stoichiometric composition, is formed in the first metal oxide film 402. Providing such a region allows oxygen to be supplied to the first insulating film or the oxide semiconductor film which is formed later, and accordingly, defects of oxygen vacancy in the oxide semiconductor film can be suppressed.

In the case where gallium oxide is used for the first metal oxide film 402, the composition of gallium oxide can be $Ga_2O_{3+\alpha}$ ($\alpha>0$) by performance of oxygen doping. The value of α can be for example, larger than or equal to 0.04 and smaller than or equal to 0.09. Alternatively, in the case where aluminum oxide is used for the first metal oxide film 402, the composition of aluminum oxide can be $Al_2O_{3+\alpha}$ ($\alpha>0$) by performance of oxygen doping. Alternatively, in the case where aluminum gallium oxide is used for the first metal oxide film 402, the composition of aluminum gallium oxide can be $Al_xGa_{2-x}O_{3+\alpha}$ ($1<x<2$, $\alpha>0$) by performance of oxygen doping. Alternatively, in the case where gallium aluminum oxide is used for the first metal oxide film 402, the composition of gallium aluminum oxide can be $Al_xGa_{2-x}O_{3+\alpha}$ ($0<x\leq1$, $\alpha>0$) by performance of oxygen doping.

Figure 3A:
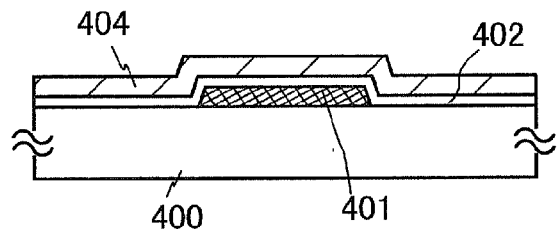
FIGS. 3A to 3E are cross-sectional views illustrating an example of a manufacturing process of a semiconductor device.

Next, the first insulating film 404 is formed over the first metal oxide film 402 (FIG. 3A). Thus, the first gate insulating film is formed. The first insulating film 404 can be formed to a thickness, for example, greater than or equal 3 nm and less than or equal to 150 nm, preferably, greater than or equal to 9 nm and less than or equal to 100 nm. Further, as the first insulating film 404, an insulating film containing oxygen is preferably used, and for example, a silicon oxide film can be used.

Considering that charge sources and charge trapping centers should be reduced, it is desirable to sufficiently reduce an impurity such as hydrogen or water in the first insulating film 404. This idea is similar to the idea of reduction of impurities in an oxide semiconductor film. Further, for formation of the first insulating film 404, it is preferable to employ a sputtering method with which hydrogen, water, or the like is unlikely to enter a film to be formed.

Then, the first insulating film 404 is preferably subjected to oxygen doping treatment. Oxygen doping treatment is performed on the first insulating film 404, whereby a region containing oxygen with a higher proportion than the stoichiometric composition is formed in the first insulating film 404. Providing such a region allows oxygen to be supplied to the oxide semiconductor film which is formed later, and accordingly, defects of oxygen vacancy in the oxide semiconductor film can be suppressed. Note that oxygen doping treatment performed after formation of the first insulating film 404 may also serve as the above-described oxygen doping treatment performed on the first metal oxide film 402.

In the case where a silicon oxide film is used as the first insulating film 404, the composition of the silicon oxide film can be $SiO_{2+\alpha}$ ($\alpha>0$) by performance of oxygen doping.

Next, the oxide semiconductor film 403 is formed to a thickness greater than or equal to 3 nm and less than or equal to 30 nm over the first insulating film 404 by a sputtering method. The thickness in the above range is preferable because when the thickness of the oxide semiconductor film 403 is too large (for example, when the thickness is greater than or equal to 50 nm), the transistor might be normally on. Note that the first metal oxide film 402, the first insulating film 404, and the oxide semiconductor film 403 are preferably formed successively without being exposed to the air.

Examples of oxide semiconductors used for the oxide semiconductor film 403 include an In—Sn—Ga—Zn—O-based oxide semiconductor which is an oxide of four metal elements; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor which are oxides of three metal elements; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, and In—Ga—O-based oxide semiconductor which are oxides of two metal elements; and an In—O-based oxide semiconductor, a Sn—O-based oxide semiconductor, and a Zn—O-based oxide semiconductor which are oxides of a metal element. Further, $SiO_2$ may be contained in the above oxide semiconductor. Note that here, for example, an In—Ga—Zn—O-based oxide semiconductor means an oxide semiconductor containing indium (In), gallium (Ga), and zinc (Zn) and there is no particular limitation on the composition ratio. The In—Ga—Zn—O-based oxide semiconductor may contain an element other than In, Ga, and Zn.

As the oxide semiconductor film 403, a thin film formed using a material expressed by a chemical formula of $InMO_3(ZnO)_m$ (m>0) can be used. Here, M represents one or more metal elements selected from Ga, Al, Mn, or Co. For example, M can be Ga, Ga and Al, Ga and Mn, Ga and Co, or the like.

In the case where an In—Zn—O-based material is used as an oxide semiconductor, a composition ratio of a target is In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn—O-based oxide semiconductor, an atomic ratio is In:Zn:O=X:Y:Z, and the relation, Z>1.5X+Y, is satisfied.

In this embodiment, the oxide semiconductor film 403 is formed by a sputtering method with use of an In—Ga—Zn—O-based target. Further, the oxide semiconductor film 403 can be formed by a sputtering method in a rare gas (typically, argon) atmosphere, an oxygen atmosphere, or a mixed atmosphere of a rare gas and oxygen.

As a target used for forming an In—Ga—Zn—O film as the oxide semiconductor film 403 by a sputtering method, for example, an oxide target with the following composition ratio may be used: $In_2O_3$:$Ga_2O_3$:ZnO is 1:1:1 [molar ratio].

Further, a material and a composition of the target are not limited to the above. For example, a target having the following composition may be used: $In_2O_3$:$Ga_2O_3$:ZnO is 1:1:2 [molar ratio].

Further, the filling rate of the target is higher than or equal to 90% and lower than or equal to 100%, preferably higher than or equal to 95% and lower than or equal to 99.9%. With use of a target with high filling rate, the resulting oxide semiconductor film 403 has high density.

It is preferable that a high-purity gas from which an impurity such as hydrogen, water, a hydroxyl group, or a hydride is removed be used as the sputtering gas used for the formation of the oxide semiconductor film 403.

For the formation of the oxide semiconductor film 403, the substrate 400 is held in a deposition chamber kept at reduced pressure and the substrate temperature is set at higher than or equal to 100° C. and lower than or equal to 600° C., preferably higher than or equal to 200° C. and lower than or equal to 400° C. The film formation is performed while the substrate 400 is heated, so that the concentration of impurities contained in the oxide semiconductor film 403 can be reduced. In addition, damage caused by sputtering can be reduced. Then, a sputtering gas in which impurities such as hydrogen and moisture are sufficiently removed is introduced into the deposition chamber from which remaining moisture is being removed, so that the oxide semiconductor film 403 is formed over the substrate 400 with the use of the target. In order to remove moisture remaining in the deposition chamber, an entrapment vacuum pump such as a cryopump, an ion pump, or a titanium sublimation pump is preferably used. Further, an evacuation unit may be a turbo pump provided with a cold trap. In the deposition chamber which is evacuated with the cryopump, for example, a hydrogen atom, a compound containing a hydrogen atom, such as water ($H_2O$) (further preferably, also a compound containing a carbon atom), and the like are removed, whereby the concentration of impurities in the oxide semiconductor film 403 formed in the deposition chamber can be reduced.

As one example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current power supply is preferably used, in which case powder substances (also referred to as particles or dust) that are generated in deposition can be reduced and the film thickness can be uniform.

After that, heat treatment (first heat treatment) is preferably performed on the oxide semiconductor film 403. Excessive hydrogen (including water and a hydroxyl group) in the oxide semiconductor film 403 can be removed by the first heat treatment. Moreover, excessive hydrogen (including water and a hydroxyl group) in the first insulating film 404 can also be removed through the first heat treatment. The first heat treatment is performed at higher than or equal to 250° C. and lower than or equal to 700° C., preferably higher than or equal to 450° C. and lower than or equal to 600° C. or lower than the strain point of the substrate.

The heat treatment can be performed in such a way that, for example, an object is introduced into an electric furnace in which a resistance heating element or the like is used, and heated in a nitrogen atmosphere at 450° C. for an hour. During the heat treatment, the oxide semiconductor film 403 is not exposed to the air to prevent the entry of water and hydrogen.

The heat treatment apparatus is not limited to the electric furnace and may be an apparatus for heating an object by thermal radiation or thermal conduction from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object by heat treatment, such as nitrogen or a rare gas such as argon is used.

For example, as the first heat treatment, a GRTA process may be performed as follows. The object is put in an inert gas atmosphere that has been heated, heated for several minutes, and taken out from the inert gas atmosphere. The GRTA process enables high-temperature heat treatment for a short time. Moreover, the GRTA process can be employed even when the temperature exceeds the upper temperature limit of the object. Note that the inert gas may be switched to a gas including oxygen during the process. This is because defect level in the energy gap, which is due to oxygen vacancy, can be decreased by performing the first heat treatment in an atmosphere containing oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6 N (99.9999%), preferably greater than or equal to 7 N (99.99999%) (that is, the concentration of the impurities is less than or equal to 1 ppm, preferably less than or equal to 0.1 ppm).

The above heat treatment (first heat treatment) can be referred to as dehydration treatment, dehydrogenation treatment, or the like because of its effect of removing hydrogen, water, and the like. The dehydration treatment or the dehydrogenation treatment can be performed, for example, after the oxide semiconductor film 403 is processed into an island shape. Such dehydration treatment or dehydrogenation treatment may be conducted once or plural times.

The first gate insulating film (the first metal oxide film 402 and the first insulating film 404) in contact with the oxide semiconductor film 403 has been subjected to oxygen doping treatment and accordingly includes an oxygen excess region. Thus, transfer of oxygen from the oxide semiconductor film 403 to the first gate insulating film can be suppressed. In addition, the oxide semiconductor film 403 is formed to be in contact with the first gate insulating film subjected to the oxygen doping treatment, whereby oxygen can be supplied from the first gate insulating film to the oxide semiconductor film 403. The oxygen supply from the first gate insulating film to the oxide semiconductor film 403 is further promoted by performance of heat treatment in a state where the first gate insulating film subjected to the oxygen doping treatment is in contact with the oxide semiconductor film 403.

At least part of oxygen which has been added to the first gate insulating film and supplied to the oxide semiconductor film 403 preferably has a dangling bond in the oxide semiconductor. This is because the dangling bond can be bonded with hydrogen left in the oxide semiconductor film to immobilize hydrogen (make hydrogen an immovable ion).

Figure 3B:
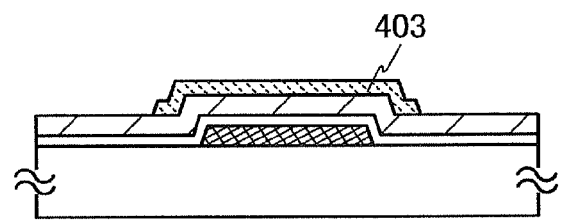
Figure 3C:
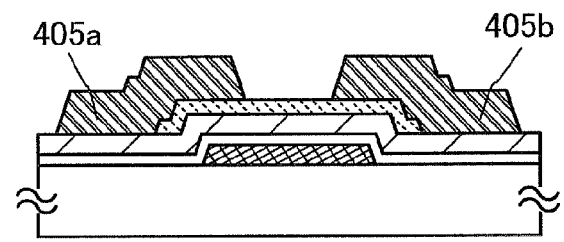

Next, the oxide semiconductor film 403 is preferably processed into the island-shape oxide semiconductor film 403 by a second photolithography step (see FIG. 3B). A resist mask used for forming the island-shaped oxide semiconductor film 403 may be formed by an inkjet method. Formation of the resist mask by an inkjet method needs no photomask; thus, manufacturing cost can be reduced. For the etching of the oxide semiconductor film 403, wet etching, dry etching, or both of them may be employed.

Next, a conductive film for forming the source electrode and the drain electrode (including a wiring formed from the same layer as the source electrode and the drain electrode) is formed over the first insulating film 404 and the oxide semiconductor film 403. As the conductive film used for the source electrode and the drain electrode, for example, a metal film containing an element selected from Al, Cr, Cu, Ta, Ti, Mo, or W, a metal nitride film containing any of the above elements as its component (e.g., a titanium nitride film, a molybdenum nitride film, or a tungsten nitride film), or the like can be used. A metal film having a high melting point such as Ti, Mo, W, or the like or a metal nitride film of any of these elements (a titanium nitride film, a molybdenum nitride film, and a tungsten nitride film) may be stacked on one of or both a lower side and an upper side of a metal film of Al, Cu, or the like. Further, the conductive film used for the source electrode and the drain electrode may be formed using a conductive metal oxide. As conductive metal oxide, indium oxide ($In_2O_3$), tin oxide ($SnO_2$), zinc oxide (ZnO), indium oxide-tin oxide alloy ($In_2O_3$—$SnO_2$; abbreviated to ITO), indium oxide-zinc oxide alloy ($In_2O_3$—ZnO), or any of these metal oxide materials in which silicon or silicon oxide is contained can be used.

Through a third photolithography step, a resist mask is formed over the conductive film and selective etching is performed, so that the source electrode 405a and the drain electrode 405b are formed. Then, the resist mask is removed (see FIG. 3C). Light exposure at the time of the formation of the resist mask in the third photolithography step may be performed using ultraviolet light, KrF laser light, or ArF laser light. The channel length L of a transistor that is to be completed later is determined by a distance between bottom edges of the source electrode 405a and the drain electrode 405b, which are adjacent to each other over the oxide semiconductor film 403. When light exposure is performed for a channel length L smaller than 25 nm, the light exposure for forming the resist mask in the third photolithography step may be performed using extreme ultraviolet light having an extremely short wavelength of several nanometers to several tens of nanometers, for example. In the light exposure by extreme ultraviolet light, the resolution is high and the focal depth is large. Thus, the channel length L of the transistor formed later can be reduced, whereby the operation speed of a circuit can be increased.

In order to reduce the number of photomasks used in a photolithography step and reduce the number of steps, an etching step may be performed with use of a multi-tone mask which is a light-exposure mask through which light is transmitted to have a plurality of intensities. A resist mask formed with use of a multi-tone mask has a plurality of thicknesses and further can be changed in shape by etching; therefore, the resist mask can be used in a plurality of etching steps for processing different patterns. Therefore, a resist mask corresponding to at least two kinds or more of different patterns can be formed by one multi-tone mask.

Thus, the number of light-exposure masks can be reduced and the number of corresponding photolithography steps can be also reduced, whereby simplification of a process can be realized.

Note that when the conductive film is etched, it is desirable that the condition be optimized so that the oxide semiconductor film 403 can be prevented from being divided by etching. However, it is difficult to obtain such an etching condition under which only the conductive film is etched and the oxide semiconductor film 403 is not etched at all. In some cases, only part of the oxide semiconductor film 403, e.g., 5% to 50% in thickness of the oxide semiconductor film 403 is etched when the conductive film is etched, whereby the oxide semiconductor film 403 having a groove portion (a recessed portion) is formed.

Next, plasma treatment may be performed using a gas such as $N_2O$, $N_2$, or Ar so that water adsorbed to a surface of an exposed portion of the oxide semiconductor film 403 is removed. In the case where plasma treatment is performed, the second insulating film 407 which is to be in contact with the oxide semiconductor film 403 is desirably formed without being exposed to the air, following the plasma treatment.

Next, the second insulating film 407 is formed so as to be in contact with part of the oxide semiconductor film 403 and cover the source electrode 405a and the drain electrode 405b. The second insulating film 407 can be formed using a material and a method similar to those of the first insulating film 404.

Then, the second insulating film 407 is preferably subjected to the oxygen doping treatment. Oxygen doping treatment is performed on the second insulating film 407, whereby a region containing oxygen with a higher proportion than the stoichiometric composition is formed in the second insulating film 407. Providing such a region allows oxygen to be supplied to the oxide semiconductor film, and accordingly, defects of oxygen vacancy in the oxide semiconductor film can be suppressed.

Figure 3D:
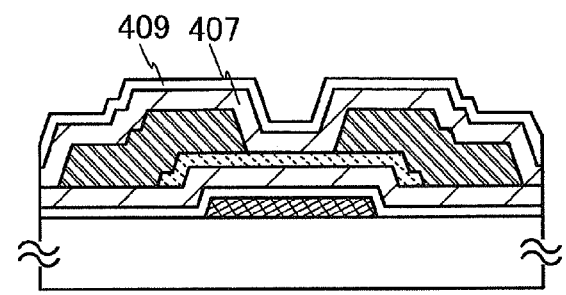
Figure 3E:
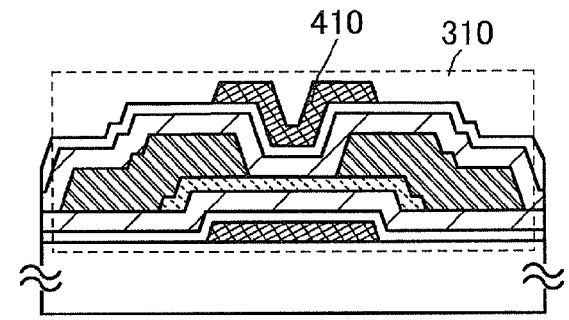

Next, the second metal oxide film 409 is formed over the second insulating film 407, so that the second gate insulating film including the second insulating film 407 and the second metal oxide film 409 is formed (FIG. 3D). The second metal oxide film 409 can be formed using a material and a method which are similar to those of the first metal oxide film 402.

Then, the second metal oxide film 409 is preferably subjected to oxygen doping treatment. Oxygen doping treatment is performed on the second metal oxide film 409, whereby a region containing oxygen with a higher proportion than the stoichiometric composition, is formed in the second metal oxide film 409. Providing such a region allows oxygen to be supplied to the oxide semiconductor film, and accordingly, defects of oxygen vacancy in the oxide semiconductor film can be suppressed. Note that oxygen doping treatment performed after formation of the second metal oxide film 409 may also serve as the above-described oxygen doping treatment performed on the second insulating film 407.

After that, second heat treatment is preferably performed in the state where part of the oxide semiconductor film 403 (channel formation region) is in contact with the second insulating film 407. The second heat treatment is performed at higher than or equal to 250° C. and lower than or equal to 700° C., preferably higher than or equal to 450° C. and lower than or equal to 600° C. or lower than the strain point of the substrate.

The second heat treatment may be performed in an atmosphere of nitrogen, oxygen, ultra-dry air (air in which a water content is 20 ppm or less, preferably 1 ppm or less, more preferably 10 ppb or less), or a rare gas (argon, helium, or the like). Note that it is preferable that water, hydrogen, or the like be not contained in the atmosphere of nitrogen, oxygen, ultra-dry air, a rare gas, or the like. It is also preferable that the purity of nitrogen, oxygen, or the rare gas which is introduced into a heat treatment apparatus be set to be greater than or equal to 6 N (99.9999%), preferably greater than or equal to 7 N (99.99999%) (that is, the concentration of the impurities is less than or equal to 1 ppm, preferably less than or equal to 0.1 ppm).

The second heat treatment is performed in the state where the oxide semiconductor film 403 is in contact with the first gate insulating film (the first metal oxide film 402 and the first insulating film 404) and the second gate insulating film (the second insulating film 407 and the second metal oxide film 409). Thus, oxygen which is one of main components of the oxide semiconductor and may be reduced due to the dehydration (or dehydrogenation) treatment can be supplied from the first and second gate insulating films containing oxygen to the oxide semiconductor film 403. Accordingly, a charge trapping center in the oxide semiconductor film 403 can be decreased. Through the above steps, the oxide semiconductor film 403 can be highly purified to be electrically i-type (intrinsic). Further, impurities in the first gate insulating film or the second gate insulating film are also removed through this heat treatment; thus, the first gate insulating film or the second gate insulating film can be purified.

Note that in this embodiment, the second heat treatment is performed after formation of the second metal oxide film 409; however, there is no particular limitation on the timing of the second heat treatment as long as it is performed after formation of the second insulating film 407. For example, the second heat treatment may be performed after formation of the second insulating film 407 and before formation of the second metal oxide film 409.

By performing the first heat treatment and the second heat treatment as described above, the oxide semiconductor film 403 can be purified so as to contain impurities other than main components as little as possible. The highly-purified oxide semiconductor film 403 contains extremely few (close to zero) carriers derived from a donor, and the carrier concentration thereof is lower than $1\times10^{14}/cm^3$, preferably lower than $1\times10^{12}/cm^3$, further preferably lower than $1\times10^{11}/cm^3$.

Next, the second gate electrode 410 is provided over the second metal oxide film 409 to overlap with a channel formation region of the oxide semiconductor film 403. Thus, the transistor 310 illustrated in FIG. 3E can be completed. The second gate electrode 410 can be formed using a material and a method which are similar to those of the first gate electrode 401. The second gate electrode 410 is provided to overlap with the channel formation region of the oxide semiconductor film 403, which enables a reduction of the amount of shift in threshold voltage of the transistor 310 between before and after a bias-temperature stress test (a BT test) by which reliability of the transistor 310 is examined. Note that the potential of the second gate electrode 410 may be the same as or different from that of the first gate electrode 401. Alternatively, the potential of the second gate electrode 410 may be GND, 0 V, or the second gate electrode 410 may be in a floating state.

Through the above steps, the transistor 310 is completed. The thus obtained transistor 310 includes the oxide semiconductor film 403 which is a highly purified film from which an impurity such as hydrogen, water, a hydroxyl group, or a hydride (also referred to as a hydrogen compound) is intentionally removed. In addition, providing the first metal oxide film 402 and the second metal oxide film 409 makes it possible to reduce or prevent reincorporation of an impurity such as water or hydrogen into the oxide semiconductor film 403 or discharge of oxygen from the first insulating film 404, the oxide semiconductor film 403, the second insulating film 407, and interfaces between the oxide semiconductor film 403 and the insulating films. Therefore, variation in the electric characteristics of the transistor 310 is suppressed and the transistor 310 is electrically stable.

Although not illustrated, a protective insulating film may be further formed so as to cover the transistor 310. As the protective insulating film, a silicon nitride film, a silicon nitride oxide film, an aluminum nitride film, or the like may be used.

Further, a planarization insulating film may be formed over the transistor 310. The planarization insulating film can be formed using a heat-resistant organic material such as acrylic, polyimide, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. Note that the planarization insulating film may be formed by stacking a plurality of insulating films formed of any of these materials.

<Manufacturing Process of Transistor 320>

Figure 4A:
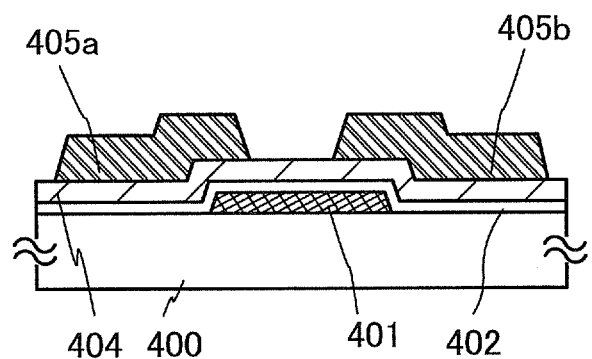
FIGS. 4A to 4C are cross-sectional views illustrating an example of a manufacturing process of the semiconductor device.

An example of a manufacturing process of the transistor 320 illustrated in FIGS. 2A to 2C will be described with reference to FIGS. 4A to 4C. Note that the manufacturing process of the transistor 320 has a lot in common with that of the transistor 310. That is, hereinafter, some description of the same part is omitted.

In a manner similar to the step illustrated in FIG. 3A, the first gate electrode 401 is formed over the substrate 400, the first metal oxide film 402 is formed to cover the first gate electrode 401, and oxygen doping treatment is performed on the first metal oxide film 402. Then, the first insulating film 404 is formed to be in contact with the first metal oxide film 402, and oxygen doping treatment is performed on the first insulating film 404. After that, a conductive film for forming a source electrode and a drain electrode (including a wiring formed from the same layer as the source electrode and the drain electrode) is formed over the first insulating film 404. Through a second photolithography step, a resist mask is formed over the conductive film and etching is selectively performed, so that the source electrode 405a and the drain electrode 405b are formed. Then, the resist mask is removed (FIG. 4A).

Next, the oxide semiconductor film 403 is formed to a thickness of greater than or equal to 3 nm and less than or equal to 30 nm over the first insulating film 404, the source electrode 405a, and the drain electrode 405b by a sputtering method.

Note that before the oxide semiconductor film 403 is formed by a sputtering method, powdery substances (also referred to as particles or dust) attached on surfaces of the first insulating film 404, the source electrode 405a, and the drain electrode 405b are preferably removed by reverse sputtering in which an argon gas is introduced and plasma is generated. Note that instead of an argon atmosphere, a nitrogen atmosphere, a helium atmosphere, an oxygen atmosphere, or the like may be used.

After that, heat treatment (first heat treatment) is preferably performed on the oxide semiconductor film 403. Excessive hydrogen (including water and a hydroxyl group) in the oxide semiconductor film 403 can be removed by the first heat treatment. Moreover, excessive hydrogen (including water and a hydroxyl group) in the first insulating film 404 can also be removed through the first heat treatment. The first heat treatment is performed at higher than or equal to 250° C. and lower than or equal to 700° C., preferably higher than or equal to 450° C. and lower than or equal to 600° C. or lower than the strain point of the substrate.

The first gate insulating film (the first metal oxide film 402 and the first insulating film 404) in contact with the oxide semiconductor film 403 has been subjected to oxygen doping treatment and accordingly includes an oxygen excess region. Thus, oxygen can be supplied from the first gate insulating film to the oxide semiconductor film 403 by this heat treatment.

Figure 4B:
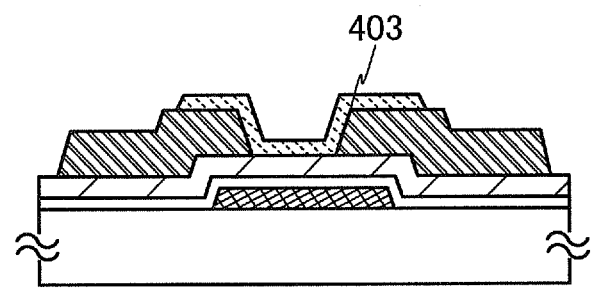

Next, the oxide semiconductor film 403 is processed into an island-shaped oxide semiconductor film 403 through a third photolithography step (FIG. 4B). A resist mask for forming the island-shaped oxide semiconductor film 403 may be formed by an inkjet method. Formation of the resist mask by an inkjet method needs no photomask; thus, manufacturing cost can be reduced. Note that the first heat treatment with respect to the oxide semiconductor film 403 may be performed after patterning of the oxide semiconductor film 403. The oxide semiconductor film 403 is not necessarily patterned.

Next, plasma treatment may be performed using a gas such as $N_2O$, $N_2$, or Ar so that water adsorbed to a surface of an exposed portion of the oxide semiconductor film 403 is removed. In the case where plasma treatment is performed, the second insulating film 407 which is to be in contact with the oxide semiconductor film 403 is desirably formed without being exposed to the air, following the plasma treatment.

Next, the second insulating film 407 is formed to cover the source electrode 405a and the drain electrode 405b and be in contact with the oxide semiconductor film 403, and then, oxygen doping treatment is performed on the second insulating film 407. After that, the second metal oxide film 409 is formed over the second insulating film 407, and oxygen doping treatment is performed on the second metal oxide film 409.

Next, it is preferable that second heat treatment be performed in the state where the oxide semiconductor film 403 is in contact with the second gate insulating film (the second insulating film 407 and the second metal oxide film 409). The second heat treatment is performed at higher than or equal to 250° C. and lower than or equal to 700° C., preferably higher than or equal to 450° C. and lower than or equal to 600° C. or lower than the strain point of the substrate.

The second heat treatment may be performed in an atmosphere of nitrogen, oxygen, ultra-dry air (air in which a water content is 20 ppm or less, preferably 1 ppm or less, further preferably 10 ppb or less), or a rare gas (argon, helium, or the like). Note that it is preferable that water, hydrogen, or the like be not contained in the atmosphere of nitrogen, oxygen, ultra-dry air, a rare gas, or the like. It is also preferable that the purity of nitrogen, oxygen, or the rare gas which is introduced into a heat treatment apparatus be set to be greater than or equal to 6 N (99.9999%), preferably greater than or equal to 7 N (99.99999%) (that is, the concentration of the impurities is less than or equal to 1 ppm, preferably less than or equal to 0.1 ppm).

The second heat treatment is performed in the state where the oxide semiconductor film 403 is in contact with the first and second gate insulating films. Thus, oxygen which is one of main components of the oxide semiconductor and may be reduced due to the dehydration (or dehydrogenation) treatment can be supplied from the first and second gate insulating films to the oxide semiconductor film 403. Accordingly, a charge trapping center in the oxide semiconductor film 403 can be decreased. Through the above steps, the oxide semiconductor film 403 can be highly purified to be electrically i-type (intrinsic). Further, impurities in the first gate insulating film or the second gate insulating film (the first metal oxide film 402 and the first insulating film 404, or the second insulating film 407 and the second metal oxide film 409) can also be removed through this heat treatment; thus, the first gate insulating film or the second gate insulating film can be purified.

Figure 4C:
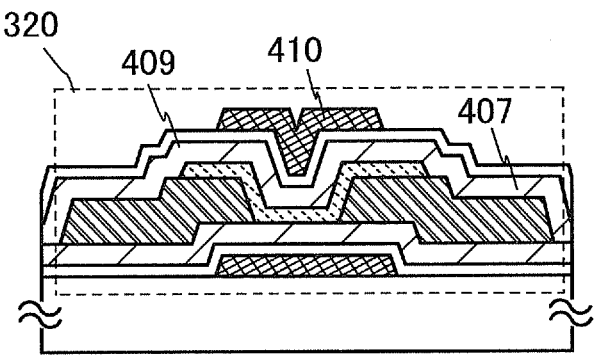

Then, the second gate electrode 410 is provided over the second metal oxide film 409 to overlap with a channel formation region of the oxide semiconductor film 403, whereby the transistor 320 illustrated in FIG. 4C can be completed. The second gate electrode 410 can be formed using a material and a method which are similar to those of the first gate electrode 401.

Through the above steps, the transistor 320 is completed (see FIG. 4C). The thus obtained transistor 320 includes the oxide semiconductor film 403 which is a highly purified film from which an impurity such as hydrogen, water, a hydroxyl group, or a hydride (also referred to as a hydrogen compound) is intentionally removed. In addition, providing the first metal oxide film 402 and the second metal oxide film 409 makes it possible to reduce or prevent reincorporation of an impurity such as water or hydrogen into the oxide semiconductor film 403 or discharge of oxygen from the first insulating film 404, the oxide semiconductor film 403, the second insulating film 407, and interfaces between the oxide semiconductor film 403 and the insulating films. Therefore, variation in the electric characteristics of the transistor 320 is suppressed and the transistor 320 is electrically stable.

As described above, a semiconductor device including an oxide semiconductor, which has stable electric characteristics, can be provided. Therefore, a semiconductor device with high reliability can be provided.

The methods and structures described in this embodiment can be combined as appropriate with any of the methods and structures described in the other embodiments.

Embodiment 2

A semiconductor device (also referred to as a display device) with a display function can be manufactured using the transistor an example of which is described in Embodiment 1. Moreover, some or all of the driver circuits which include the transistors can be formed over a substrate where the pixel portion is formed, whereby a system-on-panel can be obtained.

Figure 5A:
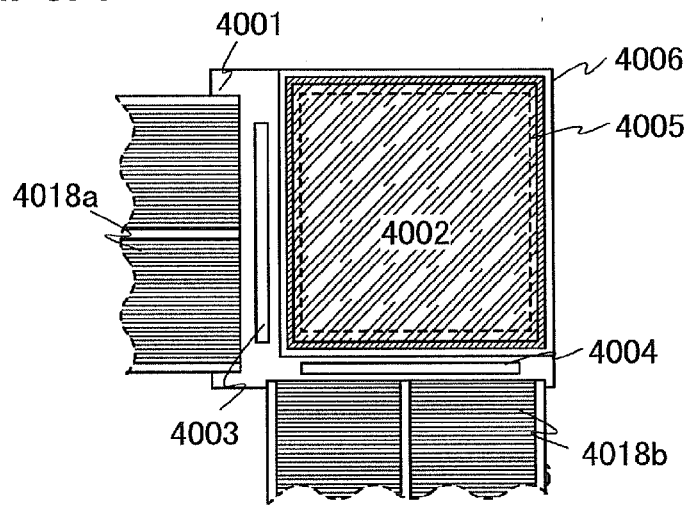
FIGS. 5A to 5C each illustrate an embodiment of a semiconductor device.

In FIG. 5A, a sealant 4005 is provided so as to surround a pixel portion 4002 provided over a first substrate 4001, and the pixel portion 4002 is sealed between the first substrate 4001 and a second substrate 4006. In FIG. 5A, a signal line driver circuit 4003 and a scan line driver circuit 4004 which are formed using a single crystal semiconductor film or a polycrystalline semiconductor film over a substrate separately prepared are mounted over the first substrate 4001, in a region that is different from the region surrounded by the sealant 4005. Various signals and potential are supplied to the pixel portion 4002 and the signal line driver circuit 4003 and the scan line driver circuit 4004 each of which is separately formed, from flexible printed circuits (FPCs) 4018a and 4018b.

Figure 5B:
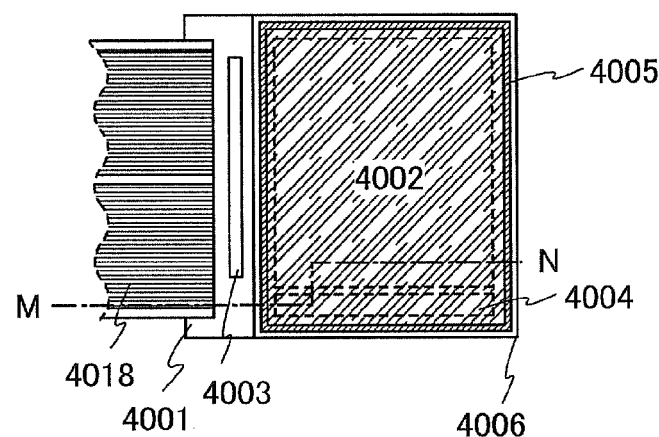
Figure 5C:
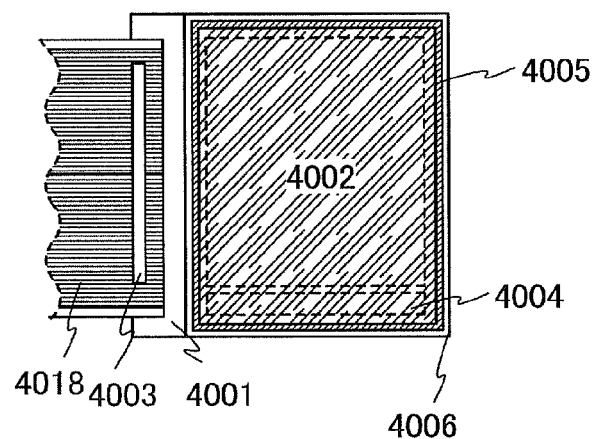

In FIGS. 5B and 5C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element, by the first substrate 4001, the sealant 4005, and the second substrate 4006. In FIGS. 5B and 5C, the signal line driver circuit 4003 which is formed using a single crystal semiconductor film or a polycrystalline semiconductor film over a substrate separately prepared is mounted over the first substrate 4001, in a region that is different from the region surrounded by the sealant 4005. In FIGS. 5B and 5C, various signals and potential are supplied to the signal line driver circuit 4003 which is separately formed, the scan line driver circuit 4004, and the pixel portion 4002 from an FPC 4018.

Although FIGS. 5B and 5C each illustrate an example in which the signal line driver circuit 4003 is formed separately and mounted on the first substrate 4001, the display device according to the present invention is not limited to this structure. The scan line driver circuit may be separately formed and then mounted, or only part of the signal line driver circuit or only part of the scan line driver circuit may be separately formed and then mounted.

Note that there is no particular limitation on a connection method of a separately formed driver circuit, and a chip on glass (COG) method, a wire bonding method, a tape automated bonding (TAB) method or the like can be used. FIG. 5A illustrates an example in which the signal line driver circuit 4003 and the scan line driver circuit 4004 are mounted by a COG method. FIG. 5B illustrates an example in which the signal line driver circuit 4003 is mounted by a COG method. FIG. 5C illustrates an example in which the signal line driver circuit 4003 is mounted by a TAB method.

In addition, the display device includes a panel in which the display element is sealed, and a module in which an IC and the like including a controller are mounted on the panel.

Note that a display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

Further, the pixel portion and the scan line driver circuit which are provided over the first substrate include a plurality of transistors and the transistor which is described in Embodiment 1 can be used therefor.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Figure 6:
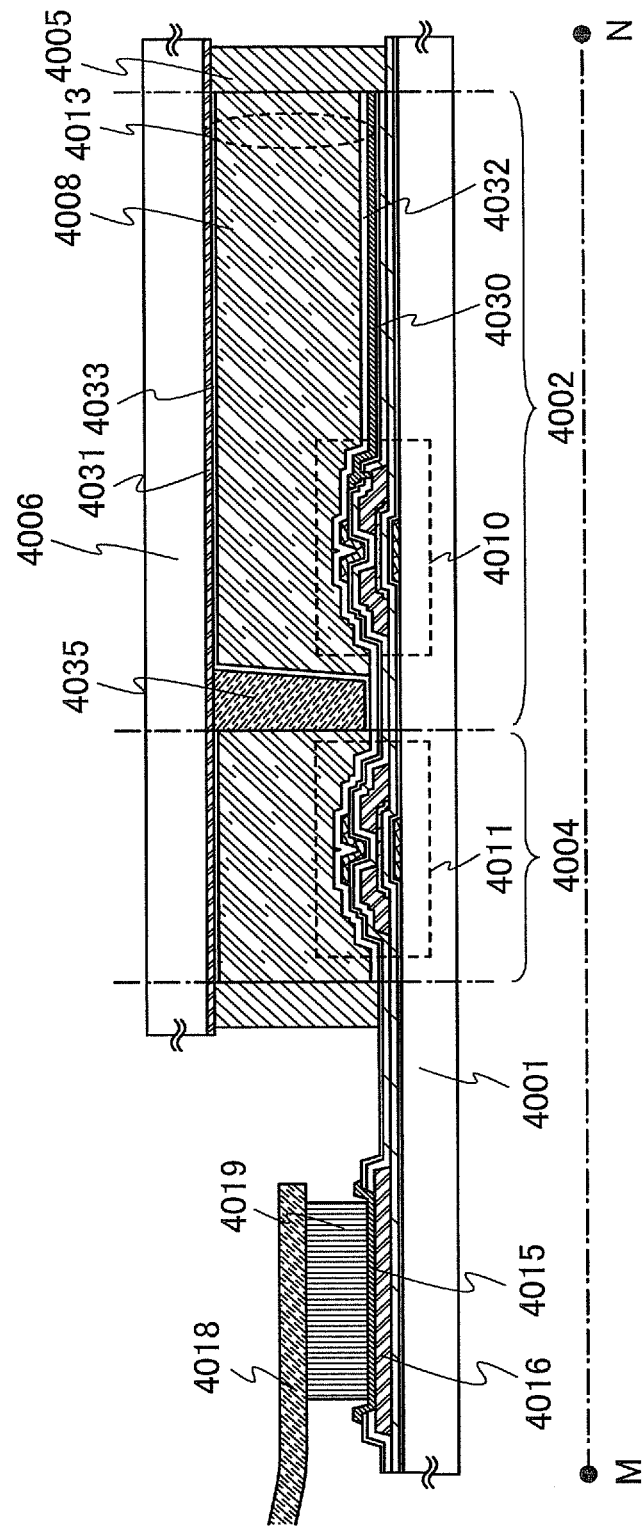
FIG. 6 illustrates an embodiment of a semiconductor device.
Figure 7:
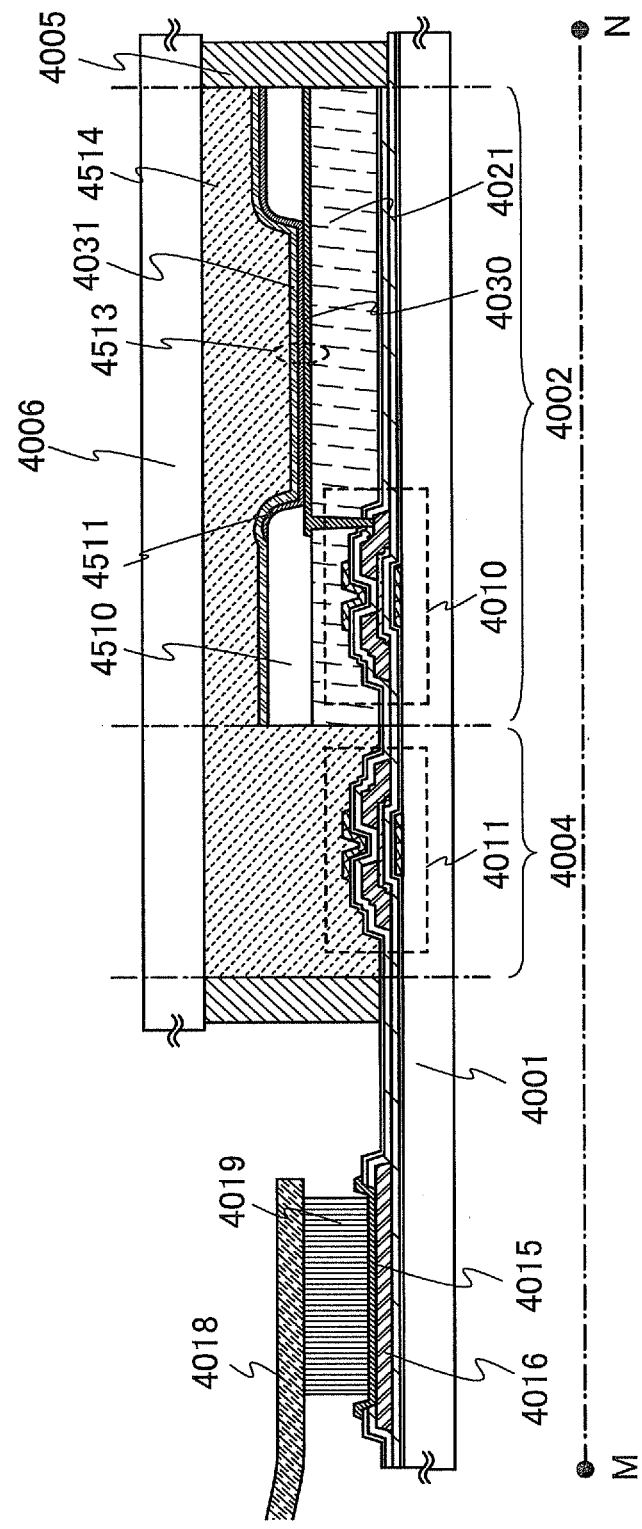
FIG. 7 illustrates an embodiment of a semiconductor device.
Figure 8:
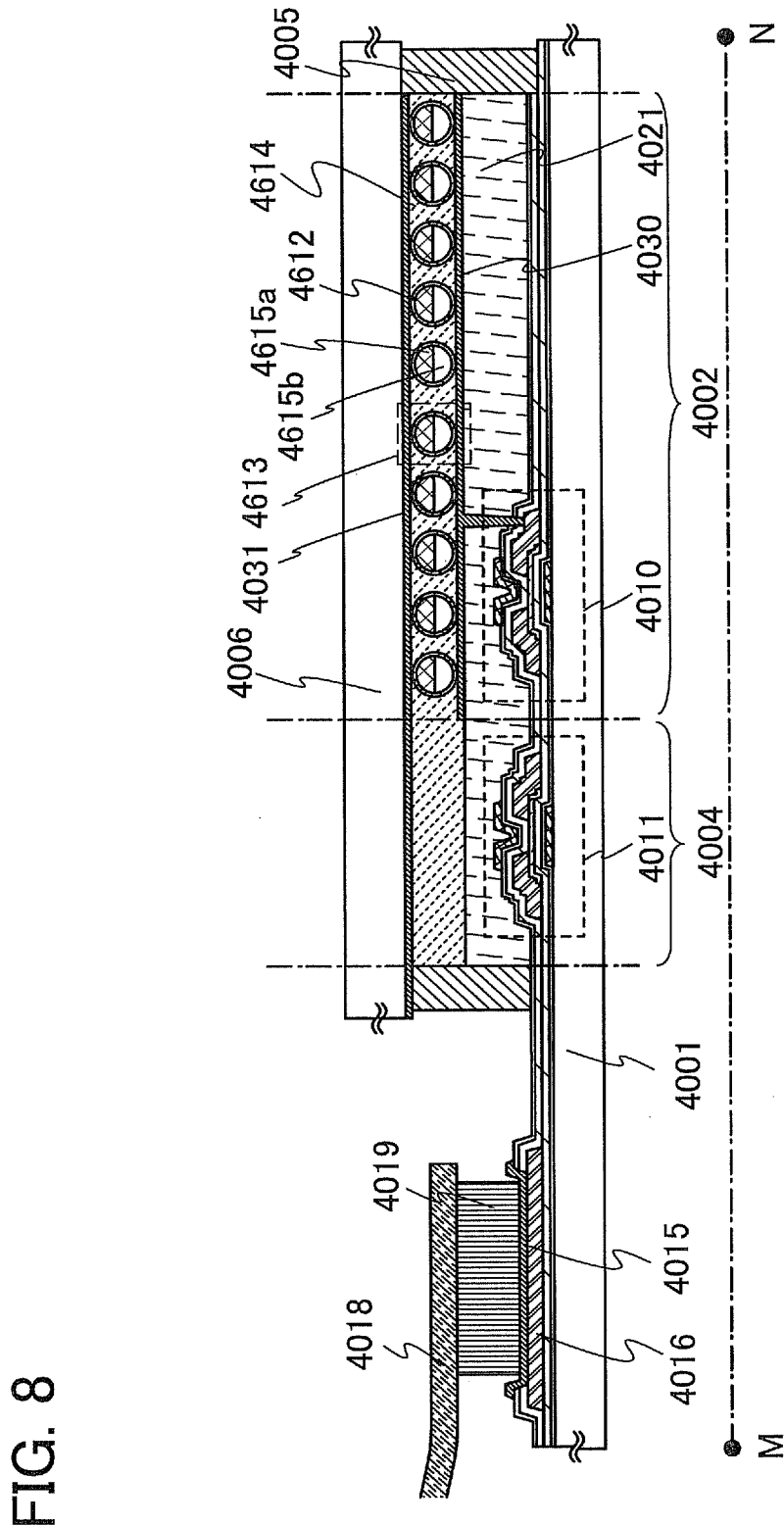
FIG. 8 illustrates an embodiment of a semiconductor device.

One embodiment of the semiconductor device is described with reference to FIG. 6, FIG. 7, and FIG. 8. FIG. 6, FIG. 7, and FIG. 8 correspond to cross-sectional views along a line M-N in FIG. 5B.

As shown in FIG. 6, FIG. 7, and FIG. 8, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed from the same conductive film as a first electrode layer 4030. The terminal electrode 4016 is formed from the same conductive film as a source electrode and a drain electrode of transistors 4010 and 4011.

Each of the pixel portion 4002 and the scan line driver circuit 4004 which are provided over the first substrate 4001 includes a plurality of transistors. In FIG. 6, FIG. 7, and FIG. 8, the transistor 4010 included in the pixel portion 4002 and the transistor 4011 included in the scan line driver circuit 4004 are illustrated as an example.

In this embodiment, any of the transistors shown in Embodiment 1 can be applied to the transistors 4010 and 4011. Variation in the electric characteristics of the transistors 4010 and 4011 is suppressed and the transistors 4010 and 4011 are electrically stable. Thus, as the semiconductor devices illustrated in FIG. 6, FIG. 7, and FIG. 8, a semiconductor device with high reliability can be obtained.

The transistor 4010 included in the pixel portion 4002 is electrically connected to a display element to form a display panel. There is no particular limitation on the kind of the display element as long as display can be performed, and a variety of kinds of display elements can be employed.

An example of a liquid crystal display device using a liquid crystal element as a display element is shown in FIG. 6. In FIG. 6, a liquid crystal element 4013 which is a display element includes the first electrode layer 4030, a second electrode layer 4031, and a liquid crystal layer 4008. Insulating films 4032 and 4033 serving as alignment films are provided so that the liquid crystal layer 4008 is interposed therebetween. The second electrode layer 4031 is provided on the second substrate 4006 side, and the first electrode layer 4030 and the second electrode layer 4031 are stacked, with the liquid crystal layer 4008 interposed therebetween.

A columnar spacer denoted by reference numeral 4035 is obtained by selective etching of an insulating film and is provided in order to control the thickness (a cell gap) of the liquid crystal layer 4008. Alternatively, a spherical spacer may also be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 wt. % or more of a chiral material is mixed is used for the liquid crystal layer in order to improve the temperature range. The liquid crystal composition which includes a liquid crystal exhibiting a blue phase and a chiral agent has a short response time of 1 msec or less, has optical isotropy, which makes the alignment process unneeded, and has a small viewing angle dependence. In addition, since an alignment film does not need to be provided and thus rubbing treatment is unnecessary, electrostatic discharge damage caused by the rubbing treatment can be prevented and defects and damage of the liquid crystal display device in the manufacturing process can be reduced. Thus, productivity of the liquid crystal display device can be increased.

The specific resistivity of the liquid crystal material is $1 \times 10^9$ Ω·cm or more, preferably $1 \times 10^{11}$ Ω·cm or more, further preferably $1 \times 10^{12}$ Ω·cm or more. The value of the specific resistivity in this specification is measured at 20° C.

The size of a storage capacitor formed in the liquid crystal display device is set considering the leakage current of the transistor provided in the pixel portion or the like so that charge can be held for a predetermined period. By using the transistor including the high-purity oxide semiconductor film, it is enough to provide a storage capacitor having capacitance that is ⅓ or less, preferably ⅕ or less of liquid crystal capacitance of each pixel.

In the transistor including the highly purified oxide semiconductor film of this embodiment, the current in an off state (the off-state current) can be made low. Accordingly, an electrical signal such as an image signal can be held for a longer period in the pixel, and an interval between writing operations can be set longer in an on state. Accordingly, frequency of refresh operation can be reduced, which leads to an effect of suppressing power consumption.

In addition, the transistor including the highly purified oxide semiconductor film of this embodiment can have relatively high field-effect mobility and thus can operate at high speed. Therefore, by using the transistor in a pixel portion of a liquid crystal display device, a high-quality image can be provided. In addition, since the above transistor can be provided in each of a driver circuit portion and a pixel portion provided over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. The vertical alignment mode is a method of controlling alignment of liquid crystal molecules of a liquid crystal display panel, in which liquid crystal molecules are aligned vertically to a panel surface when no voltage is applied. Some examples are given as a vertical alignment mode. For example, a multi-domain vertical alignment (MVA) mode, a patterned vertical alignment (PVA) mode, an ASV mode, or the like can be employed. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

In addition, it is possible to employ a time-division display method (also called a field-sequential driving method) with use of a plurality of light-emitting diodes (LEDs) as a backlight. By employing a field-sequential driving method, color display can be performed without using a color filter.

As a display method in the pixel portion, a progressive method, an interlace method or the like can be employed. Further, color elements controlled in a pixel for color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. The present invention is not limited to the application to a display device for color display but can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In the organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes is transparent. A transistor and a light-emitting element are formed over a substrate. The light-emitting element can employ any of the following emission structures: a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side.

FIG. 7 illustrates an example of a light-emitting device in which a light-emitting element is used as a display element. A light-emitting element 4513 which is a display element is electrically connected to the transistor 4010 provided in the pixel portion 4002. A structure of the light-emitting element 4513 is not limited to the stacked-layer structure including the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

A partition wall 4510 can be formed using an organic insulating material or an inorganic insulating material. It is particularly preferable that the partition wall 4510 be formed using a photosensitive resin material to have an opening over the first electrode layer 4030 so that a sidewall of the opening is formed as a tilted surface with continuous curvature.

The electroluminescent layer 4511 may be formed using a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, poly(vinyl chloride) (PVC), acrylic, polyimide, an epoxy resin, a silicone resin, poly(vinyl butyral) (PVB), or ethylene with vinyl acetate (EVA) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, an electronic paper in which electronic ink is driven can be provided as the display device. The electronic paper is also called an electrophoretic display device (electrophoretic display) and has advantages in that it has the same level of readability as regular paper, it has less power consumption than other display devices, and it can be set to have a thin and light form.

An electrophoretic display device can have various modes. An electrophoretic display device contains a plurality of microcapsules dispersed in a solvent or a solute, and each microcapsule contains first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, or a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

FIG. 8 illustrates an active matrix electronic paper as one embodiment of a semiconductor device. The electronic paper in FIG. 8 is an example of a display device using a twisting ball display system.

Between the first electrode layer 4030 connected to the transistor 4010 and the second electrode layer 4031 provided on the second substrate 4006, spherical particles 4613 each of which includes a black region 4615a, a white region 4615b, and a cavity 4612 which is filled with liquid around the black region 4615a and the white region 4615b, are provided. A space around the spherical particles 4613 is filled with a filler 4614 such as a resin. The second electrode layer 4031 corresponds to a common electrode (counter electrode). The second electrode layer 4031 is electrically connected to a common potential line.

In FIG. 6, FIG. 7, and FIG. 8, as the first substrate 4001 and the second substrate 4006, flexible substrates, for example, plastic substrates having a light-transmitting property or the like can be used, as well as glass substrates. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

The insulating layer 4021 can be formed using an inorganic insulating material or an organic insulating material. Note that the insulating layer 4021 formed using a heat-resistant organic insulating material such as an acrylic resin, polyimide, a benzocyclobutene resin, polyamide, or an epoxy resin is preferably used as a planarization insulating film. Other than such organic insulating materials, it is possible to use a low-dielectric constant material (a low-k material), a siloxane based resin, phosphosilicate glass (PSG), borophosphosilicate glass (BPSG), or the like. The insulating layer may be formed by stacking a plurality of insulating films formed using these materials.

There is no particular limitation on the method for forming the insulating layer 4021, and the insulating layer 4021 can be formed, depending on the material, by a sputtering method, a spin coating method, a dipping method, spray coating, a droplet discharge method (e.g., an inkjet method, screen printing, or offset printing), a roll coating method, a curtain coating method, a knife coating method, or the like.

The display device displays an image by transmitting light from a light source or a display element. Therefore, the substrate and the thin films such as the insulating film and the conductive film provided for the pixel portion where light is transmitted have light-transmitting properties with respect to light in the visible-light wavelength range.

The first electrode layer 4030 and the second electrode layer 4031 (each of which may be called a pixel electrode layer, a common electrode layer, a counter electrode layer, or the like) for applying voltage to the display element may have light-transmitting properties or light-reflecting properties, depending on the direction in which light is extracted, the position where the electrode layer is provided, the pattern structure of the electrode layer, and the like.

For the first electrode layer 4030 and the second electrode layer 4031, a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added, can be used.

The first electrode layer 4030 and the second electrode layer 4031 can be formed using one or more kinds of materials selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy of any of these metals; and a nitride of any of these metals.

A conductive composition containing a conductive high molecule (also referred to as a conductive polymer) can be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof, or the like can be given.

Since the transistor is easily broken owing to static electricity or the like, a protective circuit for protecting the driver circuit is preferably provided. The protective circuit is preferably formed using a nonlinear element.

As described above, by using any of the transistors described in Embodiment 1, a semiconductor device having high reliability can be provided. Note that the transistors described in Embodiment 1 can be applied to not only semiconductor devices having the display functions described above but also semiconductor devices having a variety of functions, such as a power device which is mounted on a power supply circuit, a semiconductor integrated circuit such as an LSI, and a semiconductor device having an image sensor function of reading information of an object.

This embodiment can be implemented in appropriate combination with the structures described in the other embodiments.

Embodiment 3

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the liquid crystal display device described in the above embodiment are described.

Figure 9A:
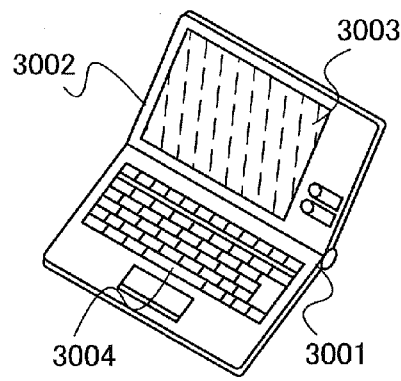
FIGS. 9A to 9F each illustrate an electronic device.

FIG. 9A illustrates a laptop personal computer, which includes a main body 3001, a housing 3002, a display portion 3003, a keyboard 3004, and the like. By applying the semiconductor device described in Embodiment 1 or 2, the laptop personal computer can have high reliability.

Figure 9B:
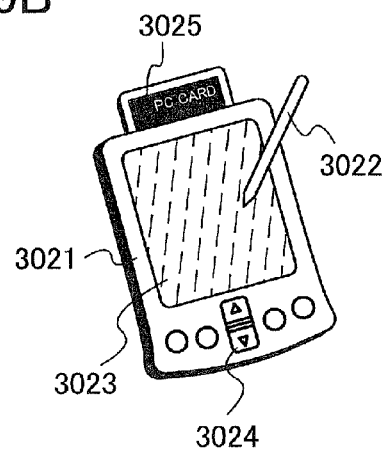

FIG. 9B illustrates a portable information terminal (PDA), which includes a display portion 3023, an external interface 3025, an operation button 3024, and the like in a main body 3021. A stylus 3022 is provided as an accessory for operation. By applying the semiconductor device described in Embodiment 1 or 2, the portable information terminal (PDA) can have higher reliability.

Figure 9C:
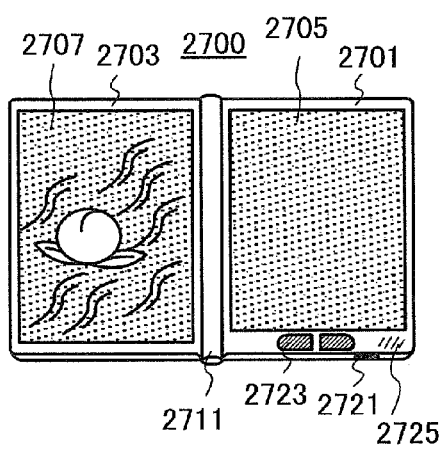

FIG. 9C illustrates an example of an electronic book reader. For example, an electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 9C) can display text and a display portion on the left side (the display portion 2707 in FIG. 9C) can display graphics. By applying the semiconductor device described in Embodiment 1 or 2, the electronic book reader 2700 can have high reliability.

Further, FIG. 9C illustrates an example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the electronic book reader 2700 may have a function of an electronic dictionary.

The electronic book reader 2700 may have a configuration capable of wirelessly transmitting and receiving data. Through wireless communication, desired book data or the like can be purchased and downloaded from an electronic book server.

Figure 9D:
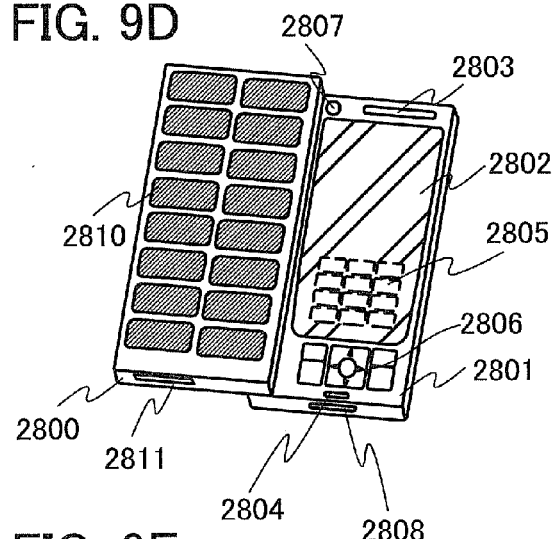

FIG. 9D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the portable information terminal, an external memory slot 2811, and the like. Further, an antenna is incorporated in the housing 2801. By applying the semiconductor device described in Embodiment 1 or 2, the mobile phone can have high reliability.

Further, the display panel 2802 is provided with a touch panel. A plurality of operation keys 2805 that are displayed as images are shown by dashed lines in FIG. 9D. Note that a boosting circuit by which a voltage output from the solar cell 2810 is increased to be sufficiently high for each circuit is also included.

In the display panel 2802, the display direction can be appropriately changed depending on a usage pattern. Further, the camera lens 2807 is provided on the same surface as the display panel 2802, and thus it can be used as a video phone. The speaker 2803 and the microphone 2804 can be used for videophone calls, recording and playing sound, and the like as well as voice calls. Further, the housings 2800 and 2801 in a state where they are developed as illustrated in FIG. 9D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be transferred.

Further, in addition to the above functions, an infrared communication function, a television reception function, or the like may be provided.

Figure 9E:
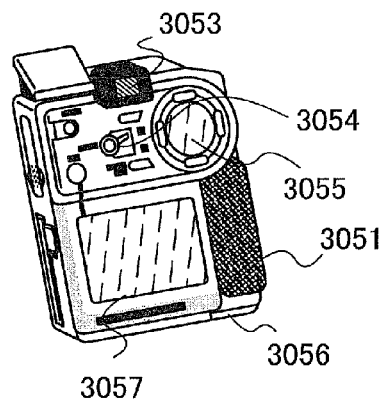

FIG. 9E illustrates a digital video camera which includes a main body 3051, a display portion A 3057, an eyepiece 3053, an operation switch 3054, a display portion B 3055, a battery 3056, and the like. By applying the semiconductor device described in Embodiment 1 or 2, the digital video camera can have high reliability.

Figure 9F:
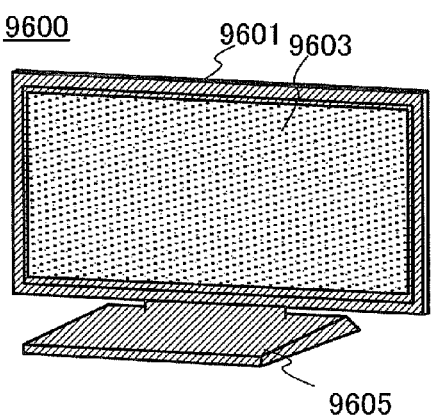

FIG. 9F illustrates an example of a television set. In a television set 9600, a display portion 9603 is incorporated in a housing 9601. The display portion 9603 can display images. Here, the housing 9601 is supported by a stand 9605. By applying the semiconductor device described in Embodiment 1 or 2, the television set 9600 can have high reliability.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With use of the receiver, general television broadcasting can be received. Moreover, when the display device is connected to a communication network with or without wires via the modem, one-way (from a sender to a receiver) or two-way (between a sender and a receiver or between receivers) information communication can be performed.

This embodiment can be implemented in appropriate combination with the structures described in the other embodiments.

EXPLANATION OF REFERENCE

310: transistor, 320: transistor, 400: substrate, 401: first gate electrode, 402: first metal oxide film, 403: oxide semiconductor film, 404: first insulating film, 405a: source electrode, 405b: drain electrode, 407: second insulating film, 409: second metal oxide film, 410: second gate electrode, 2700: electronic book reader, 2701: housing, 2703: housing, 2705: display portion, 2707: display portion, 2711: hinge, 2721: power switch, 2723: operation key, 2725: speaker, 2800: housing, 2801: housing, 2802: display panel, 2803: speaker, 2804: microphone, 2805: operation key, 2806: pointing device, 2807: camera lens, 2808: external connection terminal, 2810: solar cell, 2811: external memory slot, 3001: main body, 3002: housing, 3003: display portion, 3004: keyboard, 3021: main body, 3022: stylus, 3023: display portion, 3024: operation button, 3025: external interface, 3051: main body, 3053: eyepiece, 3054: operation switch, 3055: display portion B, 3056: battery, 3057: display portion A, 4001: substrate, 4002: pixel portion, 4003: signal line deriver circuit, 4004: scan line driver circuit, 4005: sealant, 4006: substrate, 4008: liquid crystal layer, 4010: transistor, 4011: transistor, 4013: liquid crystal element, 4015: connection terminal electrode, 4016: terminal electrode, 4018: FPC, 4019: anisotropic conductive film, 4021: insulating layer, 4030: electrode layer, 4031: electrode layer, 4032: insulating film, 4510: partition wall, 4511: electroluminescent layer, 4513: light-emitting element, 4514: filler, 4612: cavity, 4613: spherical particle, 4614: filler, 4615a: black region, 4615b: white region, 9600: television set, 9601: housing, 9603: display portion, 9605: stand This application is based on Japanese Patent Application serial no. 2010-138950 filed with Japan Patent Office on Jun. 18, 2010, the entire contents of which are hereby incorporated by reference.

The invention claimed is:

1. A semiconductor device comprising:
a first gate electrode;
a first metal oxide film over the first gate electrode;
a first oxide film over the first metal oxide film;
an oxide semiconductor film over the first oxide film;
a second oxide film over the oxide semiconductor film;
a second metal oxide film over the second oxide film; and
a second gate electrode over the second metal oxide film,
wherein the first metal oxide film contains at least one of aluminum and gallium, and
wherein an edge of the oxide semiconductor film is located inside the first gate electrode and the second gate electrode in a channel width direction.

2. The semiconductor device according to claim 1,
wherein the first metal oxide film comprises a region containing oxygen at a ratio exceeding a ratio of oxygen in a stoichiometric composition of the first metal oxide film, and
wherein the second metal oxide film comprises a region containing oxygen at a ratio exceeding a ratio of oxygen in a stoichiometric composition of the second metal oxide film.

3. The semiconductor device according to claim 1,
wherein the first oxide film comprises a region containing oxygen at a ratio exceeding a ratio of oxygen in a stoichiometric composition of the first oxide film, and
wherein the second oxide film comprises a region containing oxygen at a ratio exceeding a ratio of oxygen in a stoichiometric composition of the second oxide film.

4. The semiconductor device according to claim 1,
wherein the first metal oxide film contains at least one of gallium oxide, aluminum oxide, aluminum gallium oxide, and gallium aluminum oxide, and
wherein the second metal oxide film contains at least one of gallium oxide, aluminum oxide, aluminum gallium oxide, and gallium aluminum oxide.

5. The semiconductor device according to claim 1, further comprising a source electrode and a drain electrode in contact with the oxide semiconductor film.

6. A semiconductor device comprising:
a first gate electrode;
a first metal oxide film over the first gate electrode;
a first oxide film over the first metal oxide film;
an oxide semiconductor film over the first oxide film;
a second oxide film over the oxide semiconductor film;
a second metal oxide film over the second oxide film; and
a second gate electrode over the second metal oxide film,
wherein the first metal oxide film contains at least one of aluminum and gallium,
wherein an edge of the oxide semiconductor film is located inside the first gate electrode and the second gate electrode in a channel width direction, and
wherein the oxide semiconductor film is surrounded by the first metal oxide film and the second metal oxide film in the channel width direction.

7. The semiconductor device according to claim 6,
wherein the first metal oxide film comprises a region containing oxygen at a ratio exceeding a ratio of oxygen in a stoichiometric composition of the first metal oxide film, and
wherein the second metal oxide film comprises a region containing oxygen at a ratio exceeding a ratio of oxygen in a stoichiometric composition of the second metal oxide film.

8. The semiconductor device according to claim 6,
wherein the first oxide film comprises a region containing oxygen at a ratio exceeding a ratio of oxygen in a stoichiometric composition of the first oxide film, and
wherein the second oxide film comprises a region containing oxygen at a ratio exceeding a ratio of oxygen in a stoichiometric composition of the second oxide film.

9. The semiconductor device according to claim 6,
wherein the first metal oxide film contains at least one of gallium oxide, aluminum oxide, aluminum gallium oxide, and gallium aluminum oxide, and
wherein the second metal oxide film contains at least one of gallium oxide, aluminum oxide, aluminum gallium oxide, and gallium aluminum oxide.

10. The semiconductor device according to claim 6, further comprising a source electrode and a drain electrode in contact with the oxide semiconductor film.

11. A semiconductor device comprising:
a first gate electrode;
a first metal oxide film over the first gate electrode;
a first oxide film over the first metal oxide film;
an oxide semiconductor film over the first oxide film;
a second oxide film over the oxide semiconductor film;
a second metal oxide film over the second oxide film; and
a second gate electrode over the second metal oxide film,
wherein the first metal oxide film contains at least one of aluminum and gallium,
wherein an edge of the oxide semiconductor film is located inside the first gate electrode and the second gate electrode in a channel width direction,
wherein the oxide semiconductor film is surrounded by the first metal oxide film and the second metal oxide film in the channel width direction, and
wherein the oxide semiconductor film is surrounded by the first oxide film and the second oxide film in the channel width direction.

12. The semiconductor device according to claim 11,
wherein the first metal oxide film comprises a region containing oxygen at a ratio exceeding a ratio of oxygen in a stoichiometric composition of the first metal oxide film, and
wherein the second metal oxide film comprises a region containing oxygen at a ratio exceeding a ratio of oxygen in a stoichiometric composition of the second metal oxide film.

13. The semiconductor device according to claim 11,
wherein the first oxide film comprises a region containing oxygen at a ratio exceeding a ratio of oxygen in a stoichiometric composition of the first oxide film, and
wherein the second oxide film comprises a region containing oxygen at a ratio exceeding a ratio of oxygen in a stoichiometric composition of the second oxide film.

14. The semiconductor device according to claim 11,
wherein the first metal oxide film contains at least one of gallium oxide, aluminum oxide, aluminum gallium oxide, and gallium aluminum oxide, and
wherein the second metal oxide film contains at least one of gallium oxide, aluminum oxide, aluminum gallium oxide, and gallium aluminum oxide.

15. The semiconductor device according to claim 11, further comprising a source electrode and a drain electrode in contact with the oxide semiconductor film.

16. A semiconductor device comprising:
a first gate electrode;
a first metal oxide film over the first gate electrode;
an oxide semiconductor film over the first metal oxide film;
source and drain electrodes over the oxide semiconductor film;
a second metal oxide film over the source and drain electrodes; and
a second gate electrode over the second metal oxide film,
wherein the first metal oxide film contains at least one of aluminum and gallium,
wherein the second metal oxide film contains at least one of aluminum and gallium, and
wherein an edge of the oxide semiconductor film is located inside the first gate electrode and the second gate electrode in a channel width direction.

17. The semiconductor device according to claim 16,
wherein the first metal oxide film comprises a region containing oxygen at a ratio exceeding a ratio of oxygen in a stoichiometric composition of the first metal oxide film, and
wherein the second metal oxide film comprises a region containing oxygen at a ratio exceeding a ratio of oxygen in a stoichiometric composition of the second metal oxide film.

18. The semiconductor device according to claim 16, further comprising:
a first oxide film between the first metal oxide film and the oxide semiconductor film; and
a second oxide film between the oxide semiconductor film and the second metal oxide film.

19. The semiconductor device according to claim 16,
wherein the first metal oxide film contains at least one of gallium oxide, aluminum oxide, aluminum gallium oxide, and gallium aluminum oxide, and
wherein the second metal oxide film contains at least one of gallium oxide, aluminum oxide, aluminum gallium oxide, and gallium aluminum oxide.

* * * * *